(12) United States Patent
Shim et al.

(10) Patent No.: US 11,024,638 B2
(45) Date of Patent: Jun. 1, 2021

(54) THREE-DIMENSIONAL SEMICONDUCTOR DEVICE

(71) Applicant: SAMSUNG ELECTRONICS CO., LTD., Suwon-si (KR)

(72) Inventors: Sun Il Shim, Seoul (KR); Kyung Dong Kim, Hwaseong-si (KR); Ju Hak Song, Hwaseong-si (KR); Jee Hoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 41 days.

(21) Appl. No.: 16/419,371

(22) Filed: May 22, 2019

(65) Prior Publication Data
US 2020/0075608 A1    Mar. 5, 2020

(30) Foreign Application Priority Data
Aug. 29, 2018 (KR) .................. 10-2018-0101721

(51) Int. Cl.
| | |
|---|---|
| *H01L 27/1157* | (2017.01) |
| *H01L 27/11578* | (2017.01) |
| *H01L 27/11551* | (2017.01) |
| *H01L 27/11521* | (2017.01) |
| *H01L 27/11529* | (2017.01) |
| *H01L 27/11573* | (2017.01) |

(52) U.S. Cl.
CPC .... *H01L 27/1157* (2013.01); *H01L 27/11521* (2013.01); *H01L 27/11529* (2013.01); *H01L 27/11551* (2013.01); *H01L 27/11573* (2013.01); *H01L 27/11578* (2013.01)

(58) Field of Classification Search
CPC .......... H01L 27/1157; H01L 27/11521; H01L 27/11529; H01L 27/11551; H01L 27/11573; H01L 27/11578
See application file for complete search history.

(56) References Cited

U.S. PATENT DOCUMENTS

| | | | |
|---|---|---|---|
| 9,391,090 B2 | 7/2016 | Manorotkul et al. | |
| 9,515,087 B2* | 12/2016 | Son ................... | H01L 27/11526 |
| 9,548,316 B2 | 1/2017 | Lim et al. | |
| 9,691,782 B1 | 6/2017 | Hwang et al. | |
| 9,818,704 B2 | 11/2017 | Wang et al. | |
| 9,875,931 B2 | 1/2018 | Lee et al. | |
| 9,960,173 B2* | 5/2018 | Shimojo ........... | H01L 27/11519 |
| 9,972,636 B2 | 5/2018 | Kim et al. | |
| 10,332,902 B2* | 6/2019 | Son ....................... | H01L 29/518 |
| 2010/0195395 A1 | 8/2010 | Jeong et al. | |

(Continued)

*Primary Examiner* — Nathan W Ha
(74) *Attorney, Agent, or Firm* — Lee IP Law, PC

(57) ABSTRACT

A three-dimensional semiconductor device includes a first substrate, a second substrate on the first substrate, the second substrate including pattern portions and a plate portion covering the pattern portions, the plate portion having a width greater than a width of each of the pattern portions and being connected to the pattern portions, a lower structure between the first substrate and the second substrate, horizontal conductive patterns on the second substrate, the horizontal conductive patterns being stacked while being spaced apart from each other in a direction perpendicular to an upper surface of the second substrate, and a vertical structure on the second substrate and having a side surface opposing the horizontal conductive patterns.

20 Claims, 33 Drawing Sheets

(56) References Cited

U.S. PATENT DOCUMENTS

| | | | |
|---|---|---|---|
| 2010/0320526 A1* | 12/2010 | Kidoh | H01L 27/11582 257/324 |
| 2013/0248975 A1* | 9/2013 | Hishida | H01L 27/11578 257/324 |
| 2013/0313629 A1 | 11/2013 | Shim et al. | |
| 2016/0307632 A1* | 10/2016 | Lee | H01L 23/5286 |
| 2017/0011996 A1* | 1/2017 | Lee | H01L 27/1157 |

* cited by examiner

THREE-DIMENSIONAL SEMICONDUCTOR DEVICE

CROSS-REFERENCE TO RELATED APPLICATION

Korean Patent Application No. 10-2018-0101721, filed on Aug. 29, 2018, in the Korean Intellectual Property Office, and entitled: "Three-Dimensional Semiconductor Device," is incorporated by reference herein in its entirety.

BACKGROUND

1. Field

Embodiment relates to a three-dimensional semiconductor device.

2. Description of the Related Art

In order to increase the price competitiveness of products, there is growing demand for improvements in a degree of integration of semiconductor devices.

SUMMARY

Embodiments are directed to a three-dimensional semiconductor device, including a first substrate, a second substrate on the first substrate, the second substrate including pattern portions and a plate portion covering the pattern portions, the plate portion having a width greater than a width of each of the pattern portions and being connected to the pattern portions, a lower structure between the first substrate and the second substrate, horizontal conductive patterns on the second substrate, the horizontal conductive patterns being stacked while being spaced apart from each other in a direction perpendicular to an upper surface of the second substrate, and a vertical structure on the second substrate and having a side surface opposing the horizontal conductive patterns.

Embodiments are also directed to a three-dimensional semiconductor device, including a first substrate, a second substrate on the first substrate, the second substrate including pattern portions and a plate portion in contact with the pattern portions while covering the pattern portions, a lower structure between the first substrate and the second substrate, and an upper structure on the second substrate. The lower structure may include a peripheral wiring, the plate portion may include a semiconductor layer, and the plate portion may have a width greater than a width of each of the pattern portions.

Embodiments are also directed to a three-dimensional semiconductor device, including a first substrate, a second substrate on the first substrate, the second substrate including pattern portions and a plate portion connected to the pattern portions while covering the pattern portions, a lower structure between the first substrate and the second substrate, and including a peripheral wiring, horizontal conductive patterns on the second substrate, the horizontal conductive patterns being stacked while being spaced apart from each other in a direction perpendicular to an upper surface of the second substrate, and a vertical structure on the second substrate and having a side surface opposing the horizontal conductive patterns. The pattern portions may have a linear shape, and the plate portion may include a semiconductor layer.

BRIEF DESCRIPTION OF THE DRAWINGS

Features will become apparent to those of skill in the art by describing in detail example embodiments with reference to the attached drawings in which.

DETAILED DESCRIPTION

Figure 1A:
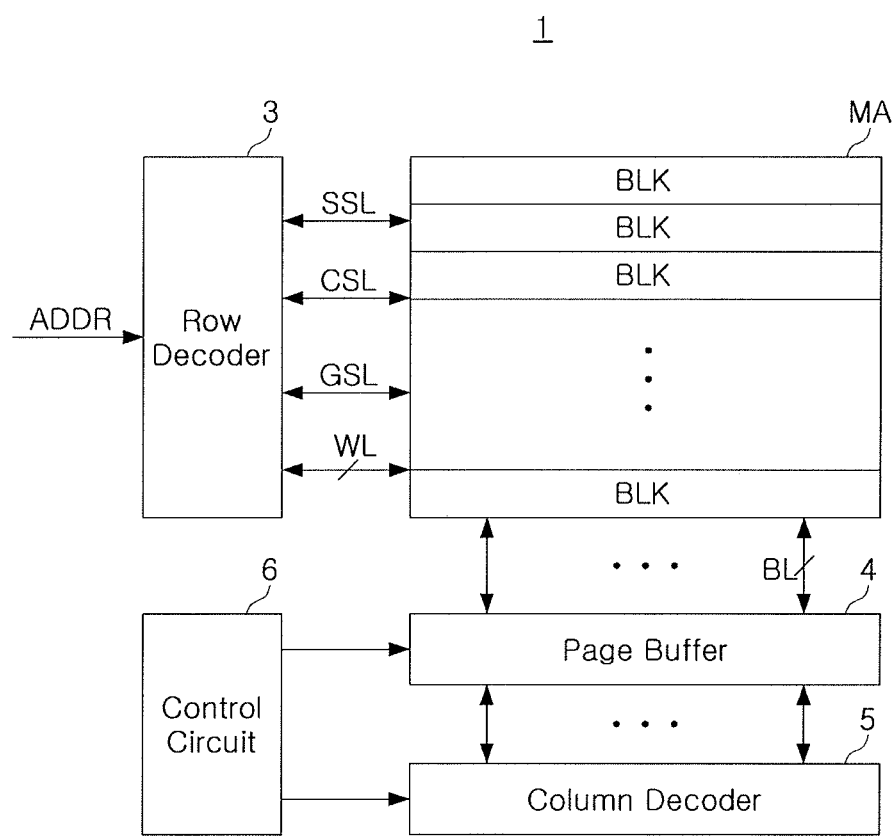
FIG. 1A illustrates a schematic block diagram of a semiconductor device according to an example embodiment.

FIG. 1A is a schematic block diagram illustrating a semiconductor device according to an example embodiment.

Referring to FIG. 1A, a semiconductor device 1 according to an example embodiment may include a memory array region MA, a row decoder 3, a page buffer 4, a column decoder 5, and a control circuit 6. The memory array region MA may include memory blocks BLK.

The memory array region MA may include memory cells arranged in a plurality of rows and a plurality of columns. The memory cells, included in the memory array region MA, may be electrically connected to the row decoder 3 through word lines WL, at least one common source line CSL, string select lines SSL, and at least one ground select line GSL, and may be electrically connected to the page buffer 4 and the column decoder 5 through bit lines BL.

In an example embodiment, among the memory cells, memory cells arranged on a common row may be connected to a single word line WL, and memory cells arranged in a common column may be connected to a single bit line BL.

The row decoder 3 may be commonly connected to the memory blocks BLK, and may provide a driving signal to word lines WL of the memory blocks BLK, selected according to a block select signal. For example, the row decoder 3 may receive address information ADDR from an external source, and may decode the address information ADDR, having been received, to determine a voltage provided to at least a portion of the word lines WL, the common source line CSL, the string select lines SSL, and the ground select line GSL, electrically connected to the memory blocks BLK.

The page buffer 4 may be electrically connected to the memory array region MA through the bit lines BL. The page buffer 4 may be connected to a bit line BL selected according to an address decoded by the column decoder 5. The page buffer 4 may temporarily store data to be stored in memory cells or may sense data stored in the memory cell, according to a mode of operation. For example, the page buffer 4 may be operated as a write driver circuit during a programming operation mode, and may be operated as a sense amplifier circuit during a reading operation mode. The page buffer 4 may receive power (for example, voltage or current) from a control logic, and may provide the power to the bit line BL, having been selected.

The column decoder 5 may provide a data transmission path between the page buffer 4 and an external device (for example, a memory controller). The column decoder 5 may decode address input from an external source, and may thus select one among the bit lines BL.

The column decoder 5 may be commonly connected to the memory blocks BLK, and may provide data information to the bit lines BL of the memory block BLK, selected according to a block select signal.

The control circuit 6 may control the overall operation of the semiconductor device 1. The control circuit 6 may receive a control signal and an external voltage, and may be operated according to the control signal, having been received. The control circuit 6 may include a voltage generator for generating voltages (for example, a programming voltage, a reading voltage, an erasing voltage, or the like) required for internal operation using an external voltage. The control circuit 6 may control reading, writing, and/or erasing operations in response to the control signals.

Figure 1B:
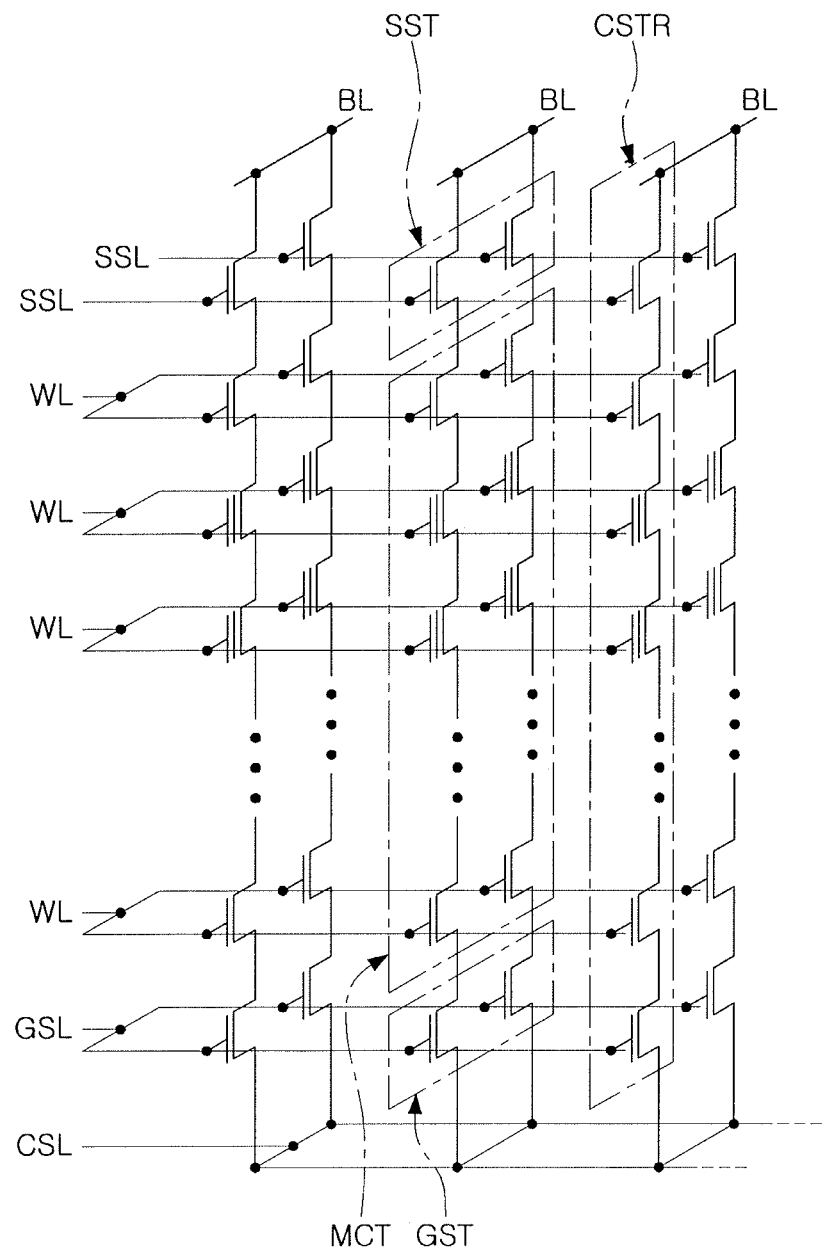
FIG. 1B illustrates a conceptual circuit diagram of a memory array region of a semiconductor device according to an example embodiment.

FIG. 1B is a conceptual circuit diagram illustrating the memory array region (MA in FIG. 1A).

Referring to FIGS. 1A and 1B, a semiconductor device according to an example embodiment may include a common source line CSL, bit lines BL, and a plurality of cell strings CSTR between the common source line CSL and the bit lines BL. The common source line CSL, the bit lines BL, and the plurality of cell strings CSTR may be disposed in the memory array region MA.

The plurality of cell strings CSTR may be connected to each of the bit lines BL in parallel. The plurality of cell strings CSTR may be commonly connected to the common source line CSL. Each of the plurality of cell strings CSTR may include a lower select transistor GST, memory cells MCT, and an upper select transistor SST, connected in series.

The memory cells MCT may be connected in series between the lower select transistor GST and the upper select transistor SST. Each of the memory cells MCT may include data storage regions capable of storing data.

The upper select transistor SST may be electrically connected to the bit lines BL, while the lower select transistor GST may be electrically connected to the common source line CSL.

The upper select transistor SST may be provided as a plurality of upper select transistors, and may be controlled by string select lines SSL. The memory cells MCT may be controlled by a plurality of word lines WL.

The lower select transistor GST may be controlled by a ground select line GSL. The common source line CSL may be commonly connected to a source of the ground select transistor GST.

In an example, the upper select transistor SST may be a string select transistor, while the lower select transistor GST may be a ground select transistor.

Figure 2:
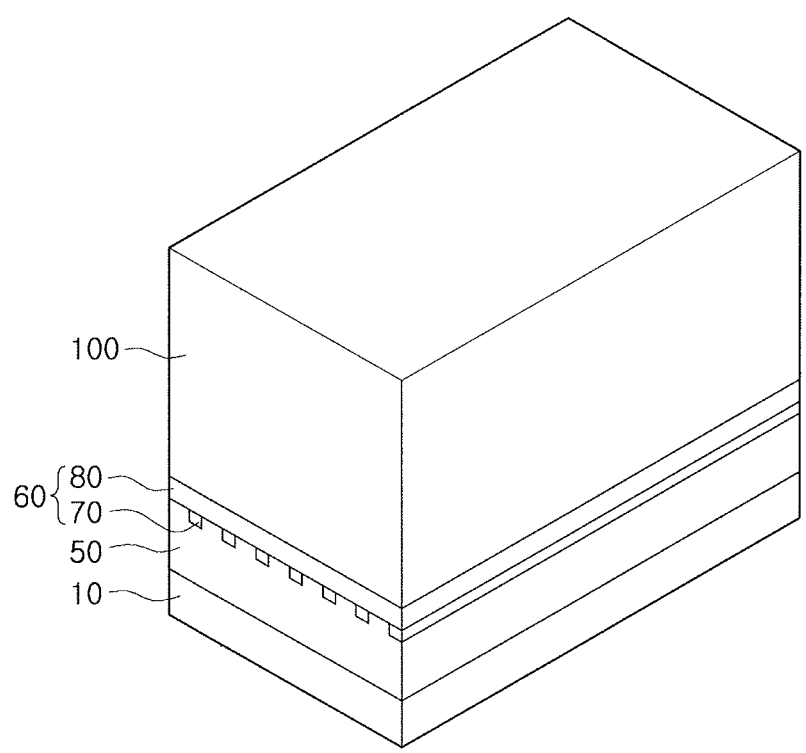
FIG. 2 illustrates a schematic perspective view of an example of a three-dimensional semiconductor device according to an example embodiment.

FIG. 2 is a schematic perspective view illustrating an example of a three-dimensional semiconductor device according to an example embodiment.

Referring to FIG. 2, a three-dimensional semiconductor device 1 according to an example embodiment may include a first substrate 10, a lower structure 50 on the first substrate 10, a second substrate 60 on the lower structure 50, and an upper structure 100 on the second substrate 60.

The first substrate 10 may be a semiconductor substrate which may be formed of a semiconductor material such as silicon, or the like. For example, the first substrate 10 may be a single crystal semiconductor substrate, for example, a single crystal silicon substrate. The lower structure 50 may include at least one among the row decoder 3, the page buffer 4, and/or the column decoder 5, illustrated in FIG. 1A.

The second substrate 60 may include pattern portions 70, and a plate portion 80 covering the pattern portions 70. The plate portion 80 may include a semiconductor layer, for example, a polycrystalline semiconductor layer. The polycrystalline semiconductor layer may include a polysilicon layer. The upper structure 100 may include the memory array region MA, described above.

Figure 3A:
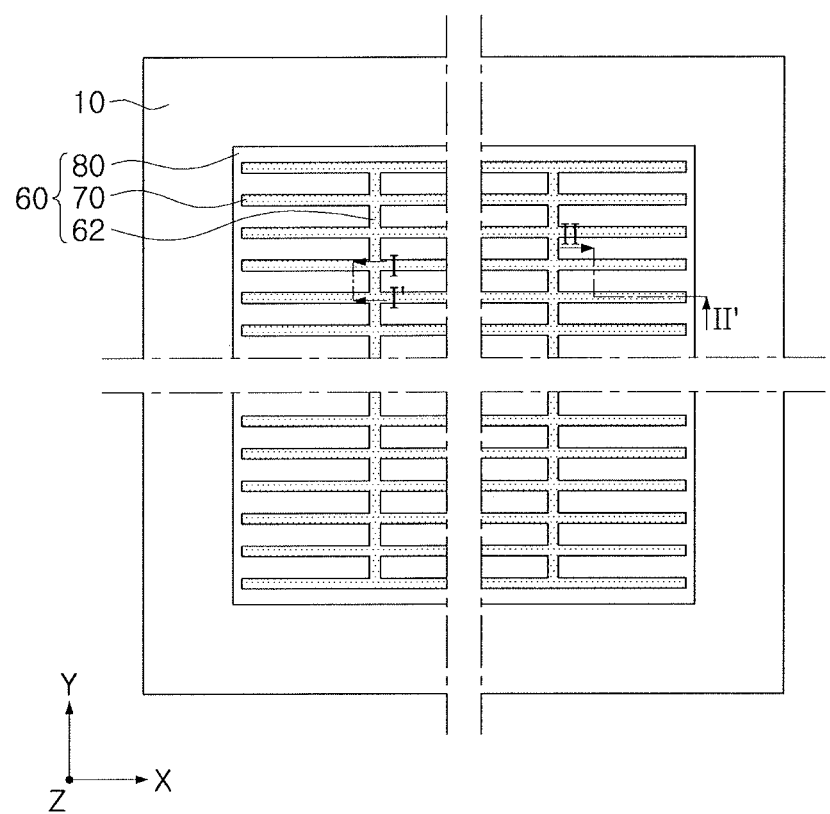
FIGS. 3A and 3B illustrate plan views of a portion of a three-dimensional semiconductor device according to an example embodiment.
Figure 3B:
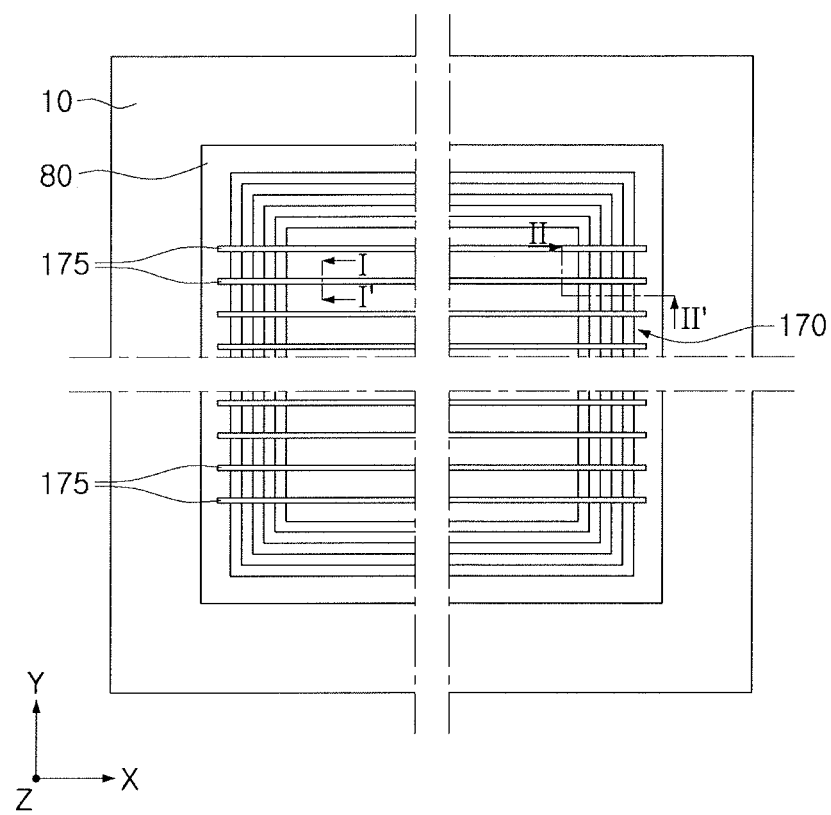
Figure 4:
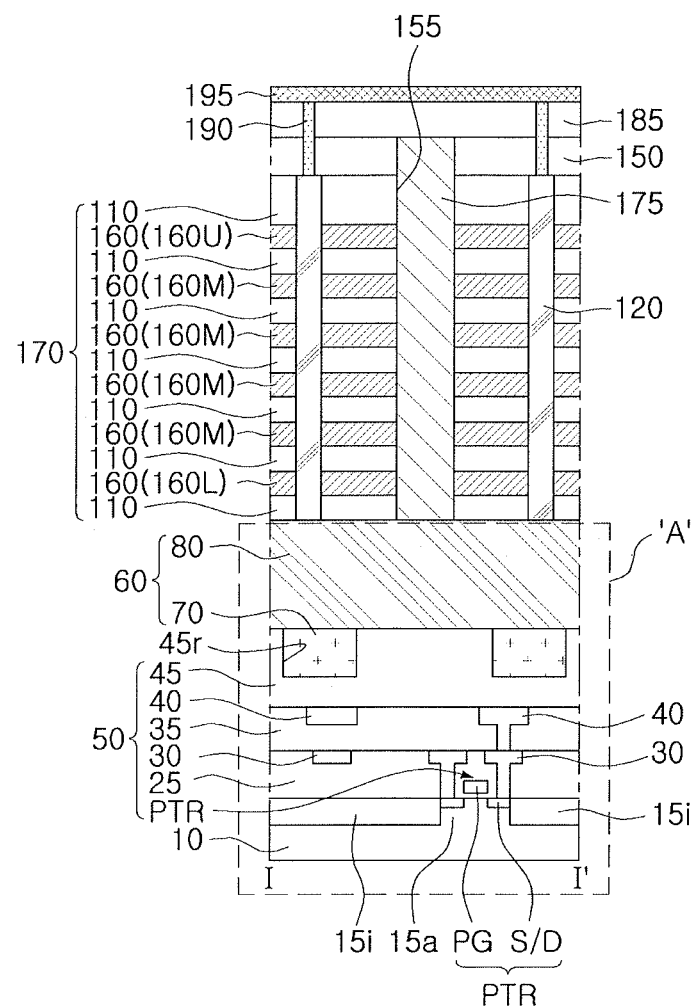
FIG. 4 illustrates a schematic cross-sectional view of a region taken along line I-I' of FIGS. 3A and 3B.
Figure 5:
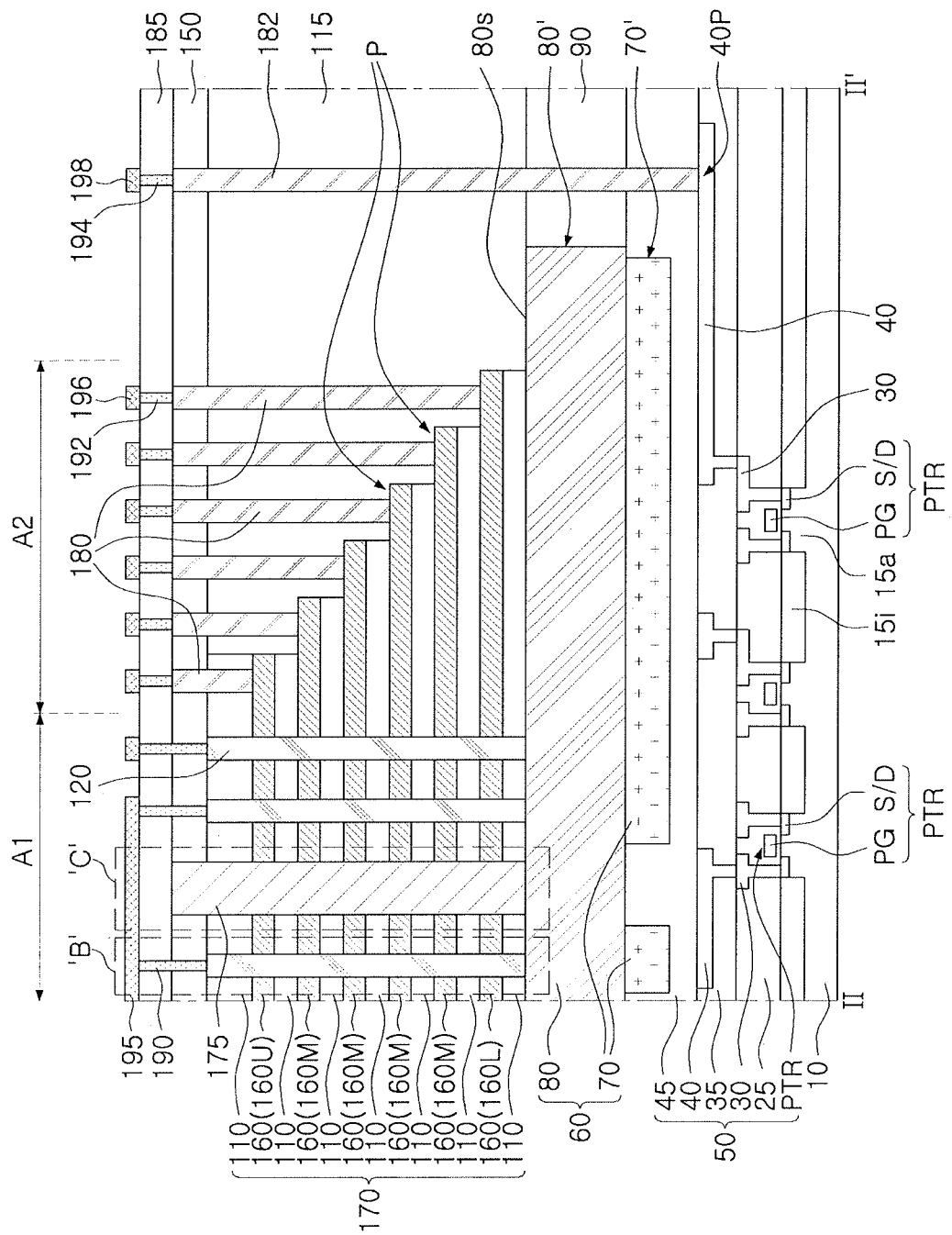
FIG. 5 illustrates a schematic cross-sectional view of a region taken along line II-II' of FIGS. 3A and 3B.

FIG. 3A is a plan view illustrating a portion of a three-dimensional semiconductor device according to an example embodiment, FIG. 3B is a plan view illustrating a portion of a three-dimensional semiconductor device according to an example embodiment, FIG. 4 is a schematic cross-sectional view illustrating a region taken along line I-I' of FIGS. 3A and 3B, and FIG. 5 is a schematic cross-sectional view illustrating a region taken along line II-II' of FIGS. 3A and 3B.

Referring to FIGS. 3A to 5, the lower structure 50 may be on the first substrate 10. The first substrate 10 may be a single crystal semiconductor substrate, as described above.

The lower structure 50 may include lower insulating layers 25, 35, and 45, peripheral wirings 30 and 40, as well as peripheral transistors PTR. The isolation regions 15i, defining peripheral active regions 15a, may be disposed in the first substrate 10.

The peripheral transistors PTR may include peripheral gates PG on the peripheral active regions 15a, and peripheral source/drains S/D disposed in the peripheral active regions 15a on both sides of the peripheral gates PG.

The peripheral wirings 30 and 40 may include first peripheral wirings 30, electrically connected to the peripheral transistors PTR, and second peripheral wirings 40, electrically connected to the first peripheral wirings 30.

The lower insulating layers 25, 35, and 45 may include a first lower insulating layer 25 surrounding a side surface of the first peripheral wirings 30, a second lower insulating layer 35 on the second lower insulating layer 25 and surrounding a side surface of the second peripheral wirings 30, and a third lower insulating layer 45 on the second lower insulating layer 35. The lower insulating layers 25, 35, and 45 may include silicon oxide.

The peripheral transistors PTR and the peripheral wirings 30 and 40 may configure a peripheral circuit of at least one among the row decoder 3, the page buffer 4, and/or the column decoder 5, illustrated in FIG. 1A.

A second substrate 60 may be on the lower structure 50. The lower structure 50 may be between the first substrate 10 and the second substrate 60. The second substrate 60 may include pattern portions 70, and a plate portion 80 connected to the pattern portions 70. The plate portion 80 may have a width greater than that of each of the pattern portions 70 and may be connected to the pattern portions 70. The plate portion 80 may be in contact with the pattern portions 70.

In an example, the second substrate 60 may further include a connection portion (62 of FIG. 3A) connecting the pattern portions 70. The pattern portions 70 may have a linear shape, and the connection portion 62 may connect the pattern portions 70 having the linear shape. The pattern portions 70 and the connection portion 62 may have an integrated structure.

In an example, the third lower insulating layer 45 may have recess regions 45r, and the pattern portions 70 may fill the recess regions 45r. Thus, a bottom surface and a side surface of the pattern portions 70 may be covered by the third lower insulating layer 45.

The plate portion 80 may include a semiconductor layer. For example, the plate portion 80 may include a polysilicon layer.

An intermediate insulating layer 90 may be on a side surface of the plate portion 80.

A stacked structure 170 may be on the plate portion 80.

The stacked structure 170 may include interlayer insulating layers 110 and horizontal conductive patterns 160. The horizontal conductive patterns 160 may be stacked on the second substrate 60 while being spaced apart from each other in a vertical direction Z, perpendicular to an upper surface 80s of the second substrate 60. The interlayer insulating layers 110 and the horizontal conductive patterns 160 may be repeatedly and alternately stacked. The interlayer insulating layers 110 may be formed of silicon oxide. The horizontal conductive patterns 160 may be gate patterns.

The horizontal conductive patterns 160 may include a lower horizontal conductive pattern 160L, an upper horizontal conductive pattern 160U, and intermediate horizontal conductive patterns 160M between the lower horizontal conductive pattern 160L and the upper horizontal conductive pattern 160U. The lower horizontal conductive pattern 160L may be lower gate pattern, the upper horizontal conductive pattern 160U may be upper gate pattern, and the intermediate horizontal conductive patterns 160M may be intermediate horizontal gate patterns.

The horizontal conductive patterns 160 are stacked in a first region A1 on the second substrate 60 while being spaced apart from each other in the direction Z perpendicular to an upper surface 80s of the second substrate 60, and may include pad regions P extended from the first region A1 to an interior of the second region A2 to be arranged in a staircase shape. In an example embodiment, the pad regions P may be modified into various forms.

In an example embodiment, the first region A1 may be the memory array region (MA of FIGS. 1A and 1B), illustrated in FIGS. 1A and 1B, or a region in which the memory array region (MA of FIGS. 1A and 1B) is located. Thus, the first region A1 may be referred to as a 'memory array region MA.'

In an example embodiment, the second region A2 may be located on one side or on both sides of the first region A1. The second region A2 may be a region provided with the pad regions P, in which the horizontal conductive patterns 160 are extended from the first region A1 and arranged in the staircase shape. The second region A2 may be referred to as an 'extended region' or a 'staircase shape region.'

In an example, the lower horizontal conductive pattern 160L may include the ground select line GSL illustrated in FIGS. 1A and 1B.

In an example, the upper horizontal conductive pattern 160U may include the string select line SSL illustrated in FIGS. 1A and 1B.

In an example, the intermediate horizontal conductive patterns 160M may include the word lines WL illustrated in FIGS. 1A and 1B.

An upper insulating layer 115 may be on the second substrate 60 and the intermediate insulating layer 90. The upper insulating layer 115 may cover the pad regions P of the horizontal conductive patterns 160.

A first capping insulating layer 150 and a second capping insulating layer 185 may be sequentially on the stacked structure 170 and the upper insulating layer 115. The upper insulating layer 115, as well as the first capping insulating layer 150 and the second capping insulating layer 185, may include silicon oxide.

In the first region A1, vertical structures 120, passing through the stacked structure 170, may be disposed. The vertical structures 120 may have a side surface opposing the horizontal conductive patterns 160. At least a portion of the vertical structure 120 may be a channel.

Separation structures 175, passing through the stacked structure 170, may be provided. The separation structures 175 may have an upper surface located at a level higher than a level of the vertical structures 120. The separation structures 175 may pass through the stacked structure 170, may be extended upwardly, and may pass through the first capping insulating layer 150. The separation structures 175 may be disposed in separation trenches 155, passing through the first capping insulating layer 150 and the stacked structure 170.

The separation structures 175 may have a linear shape, extended in a first direction X. The first direction X may be a direction parallel to an upper surface 80s of the second substrate 60.

In an example, when viewed in plan, the separation structures 175 may intersect the stacked structure 170.

Bit lines 195, gate connection wirings 196, and a peripheral connection wiring 198 may be on the second capping insulating layer 185.

Between the bit lines 195 and the vertical structures 120, bit line contact plugs 190, electrically connecting the bit lines 195 to the vertical structures 120, may be disposed.

Gate contact structures 180, electrically connected to the horizontal conductive patterns 160, may be on the pad regions P of the horizontal conductive patterns 160.

Between the gate connection wirings 196 and the gate contact structures 180, gate contact plugs 192, electrically connecting the gate connection wirings 196 to the gate contact structures 180, may be disposed.

A peripheral contact structure 182 may be on a peripheral contact region 40P of the second peripheral wirings 40. The peripheral contact structure 182 may pass through the third lower insulating layer 45, the intermediate insulating layer 90, the upper insulating layer 115, and the first capping insulating layer 150.

Between the peripheral connection wiring 198 and the peripheral contact structure 182, a peripheral contact plug 194, electrically connecting the peripheral connection wiring 198 to the peripheral contact structure 182, may be disposed.

In an example, in the second substrate 60, an end portion 80' of the plate portion 80 may have a form protruding as compared with an end portion 70' of the pattern portions 70. Various examples of the end portion of the plate portion 80 and the end portion of the pattern portions 70 will be described with reference to FIGS. 6A and 6B, respectively.

Figure 6A:
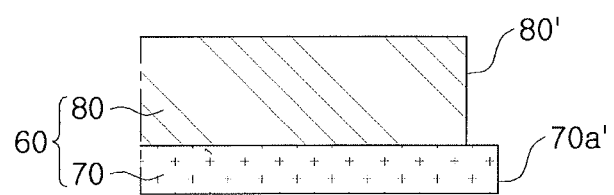
FIG. 6A illustrates a partially enlarged cross-sectional view of a portion of a modified example of a three-dimensional semiconductor device according to an example embodiment.
Figure 6B:
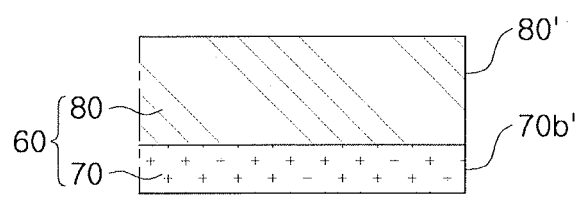
FIG. 6B illustrates a partially enlarged cross-sectional view of a portion of a modified example of a three-dimensional semiconductor device according to an example embodiment.

FIGS. 6A and 6B are partially enlarged cross-sectional views illustrating the end portion of the plate portion 80 and the end portion of the pattern portions 70.

In a modified example, referring to FIG. 6A, the pattern portions 70 may have an end portion 70a' in the form protruding as compared with an end portion 80' of the plate portion 80.

In a modified example, referring to FIG. 6B, the pattern portions 70 may have an end portion 70b' vertically aligned with an end portion 80' of the plate portion 80.

Referring again to FIGS. 3A to 5, each of the vertical structures 120, described above, may include a vertical structure, and each of the horizontal conductive patterns 160, described above, may include different material layers. An example of the vertical structures 120 and the horizontal conductive patterns 160, described above, will be described with reference to FIG. 7.

Figure 7:
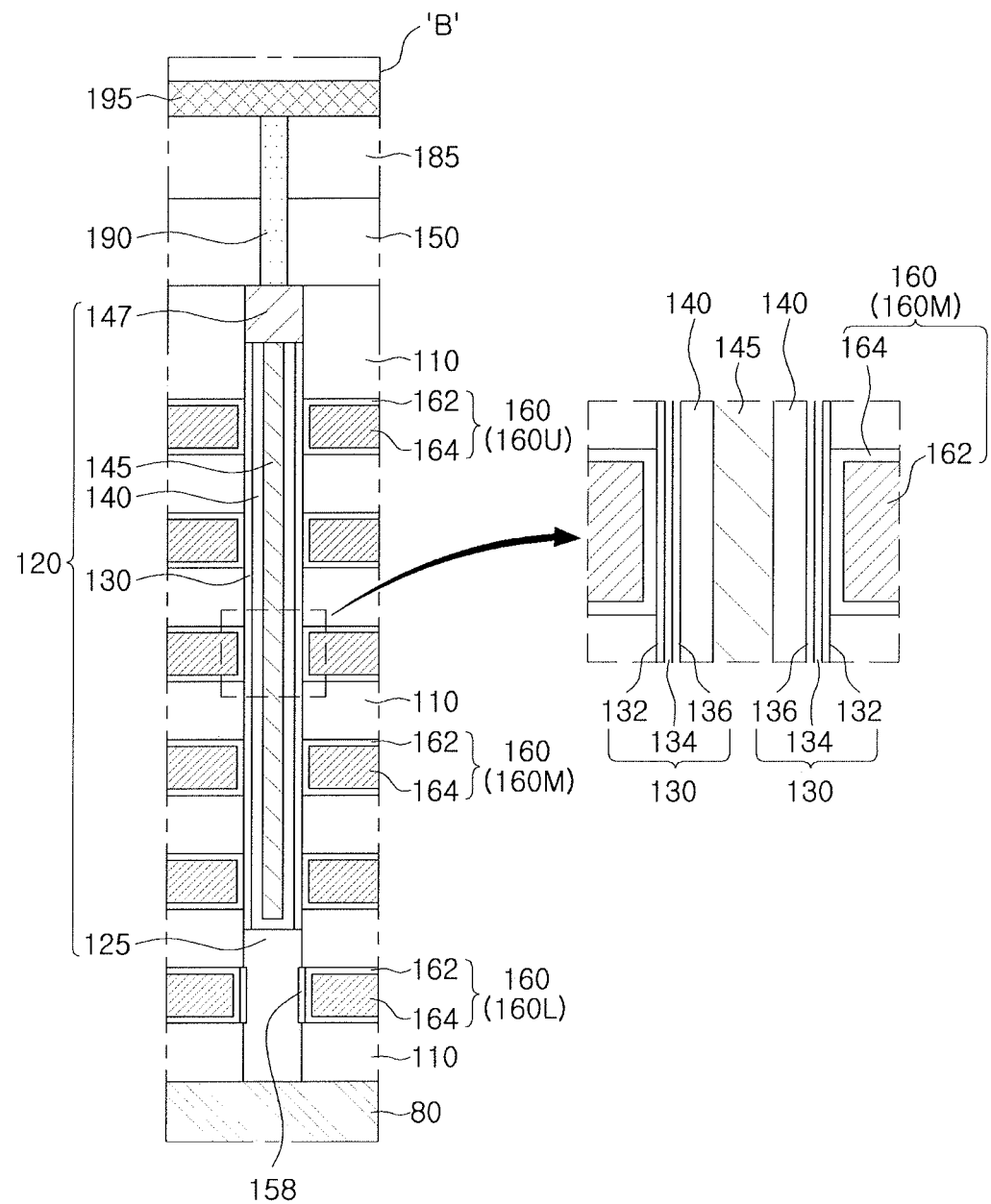
FIG. 7 illustrates a partially enlarged cross-sectional view of an enlarged region indicated by 'B' in FIG. 5.

FIG. 7 is a partially enlarged cross-sectional view illustrating an enlarged portion indicated by 'B' in FIG. 5.

Referring to FIGS. 3A to 5, and 7, each of the vertical structures 120 may include a channel semiconductor layer 140 and a gate dielectric structure 130, between the channel semiconductor layer 140 and the stacked structure 170.

In an example, each of the vertical structures 120 may further include a semiconductor pattern 125, an insulating core pattern 145 on the semiconductor pattern 125, and a pad pattern 147 on the insulating core pattern 145.

The channel semiconductor layer 140 may be disposed to surround an outer side surface of the insulating core pattern 145 while being in contact with the semiconductor pattern 135. The gate dielectric structure 130 may be disposed to surround an outer side surface of the channel semiconductor layer 140. The semiconductor pattern 125 may be an epitaxial material layer which may be formed using a selective epitaxial growth (SEG) process. The insulating core pattern 145 may be formed of an insulating material (e.g., silicon oxide, or the like). The pad pattern 147 may be formed of polysilicon having N-type conductivity, and may be a drain region. The pad pattern 147 may be on a level higher than a level of the upper horizontal conductive pattern 160U. The pad pattern 147 of the vertical structure 120 may be in contact with the bit line contact plug 190, described above, and may be electrically connected thereto.

In an example, the channel semiconductor layer 140 may pass through the horizontal conductive patterns 160. When the vertical structure 120 further includes the semiconductor pattern 125, the semiconductor pattern 125 may pass through the lower horizontal conductive pattern 160L, and the channel semiconductor layer 140 may pass through the intermediate horizontal conductive pattern 160M and the upper horizontal conductive pattern 160U. The channel semiconductor layer 140 may be formed of a polysilicon layer.

In an example, the semiconductor pattern 125 may be referred to as a channel semiconductor layer. For example, the semiconductor pattern 125 may be referred to as a lower channel semiconductor layer located in a relatively lower portion, while the channel semiconductor layer 140 may be referred to as an upper channel semiconductor layer located in a relatively upper portion.

In an example, an additional dielectric 158 between the semiconductor pattern 125 and the lower horizontal conductive pattern 160L may be further included. The additional dielectric 158 may include silicon oxide.

The gate dielectric structure 130 may include a tunnel dielectric layer 136, a data storage layer 134, and a blocking dielectric layer 132. The data storage layer 134 may be between the tunnel dielectric layer 136 and the blocking dielectric layer 132. The blocking dielectric layer 132 may be between the data storage layer 134 and the stacked structure 170.

The tunnel dielectric layer 136 may be between the data storage layer 134 and the channel semiconductor layer 140. The tunnel dielectric layer 136 may include silicon oxide and/or impurity-doped silicon oxide. The blocking dielectric layer 132 may include silicon oxide and/or high-k dielectric material. The data storage layer 134 may be formed of a material which may store data, for example, silicon nitride.

The data storage layer 134 may include regions to store data between the channel semiconductor layer 140 and the intermediate horizontal conductive patterns 160M (the intermediate horizontal conductive patterns 160M may include the word lines WL, illustrated in FIGS. 1A and 1B). For example, depending on operating conditions of a non-volatile memory device such as a flash memory device, an electron that is injected from the channel semiconductor layer 140 into the data storage layer 134 through the tunnel dielectric layer 136 may be trapped to be retained, or the electron that is trapped in the data storage layer 134 may be erased.

Thus, as described above, regions of the data storage layer 134, located between intermediate horizontal conductive patterns 160M, which may be the word lines (WL of FIGS. 1A and 1B), and the channel semiconductor layer 140 may be defined as data storage regions, and the data storage regions may configure the memory cells (MCT of FIG. 1B) illustrated in FIG. 1B.

Each of the horizontal conductive patterns 160 may include a first material layer 162 and a second material layer 164 that are different from each other. In an example, the first material layer 162 may be a high-k dielectric material such as aluminum oxide, or the like, while the second material layer 164 may be formed of a conductive material including, for example, one, or two or more, among metal nitride (e.g., TiN or WN), metal (e.g., W), metal silicide (e.g., TiSi or WSi), or doped silicon. In another example, the first material layer 162 and the second material layer 162 may be formed of different conductive materials. The first material layer 162 may be extended between the second material layer 162 and the vertical structures 120 while covering an upper surface and a lower surface of the second material layer 162.

Figure 8A:
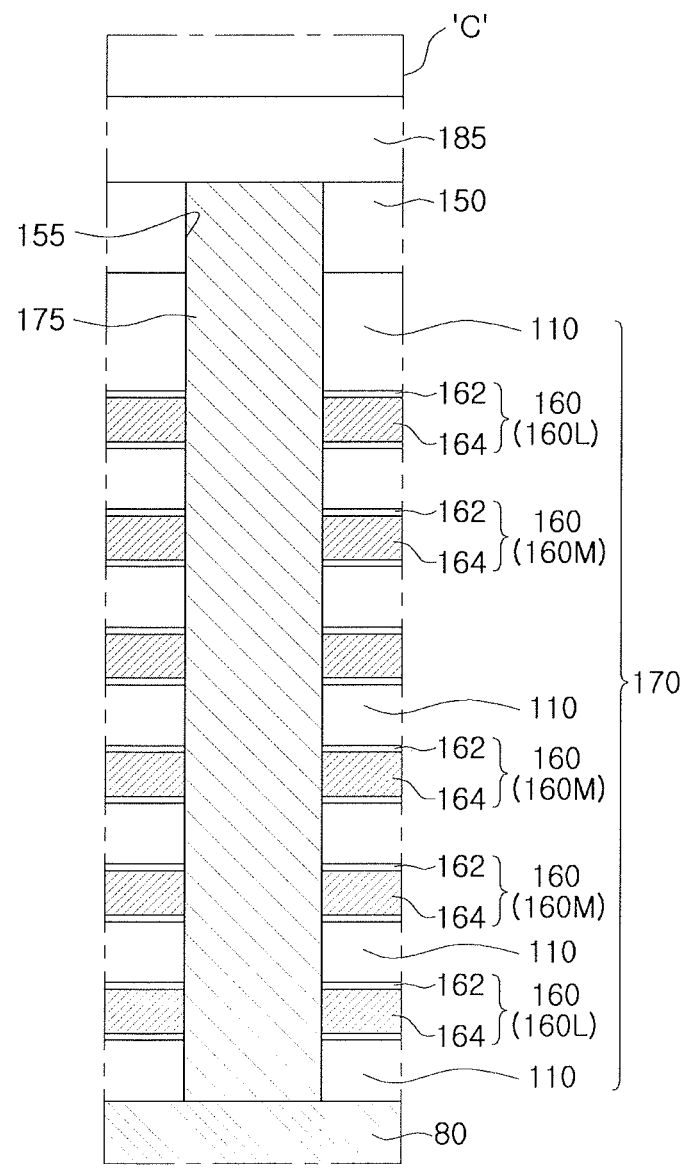
FIG. 8A illustrates a partially enlarged cross-sectional view of an enlarged region indicated by 'C' in FIG. 5.

FIG. 8A is a partially enlarged cross-sectional view illustrating an enlarged region indicated by 'C' in FIG. 5.

Referring to FIGS. 3A to 5, and 8A, each of the horizontal conductive patterns 160 may include the first material layer 162 and the second material layer 164, as described with reference to FIG. 7. The first material layer 162 may cover an upper surface and a lower surface of the second material layer 162, while the second material layer 162 may be directly in contact with the separation structures 175.

In an example, the separation structures 175 may be formed of an insulating material such as silicon oxide filling the separation trenches 155. A modified example of the separation structures 175 will be described with reference to FIG. 8B.

Figure 8B:
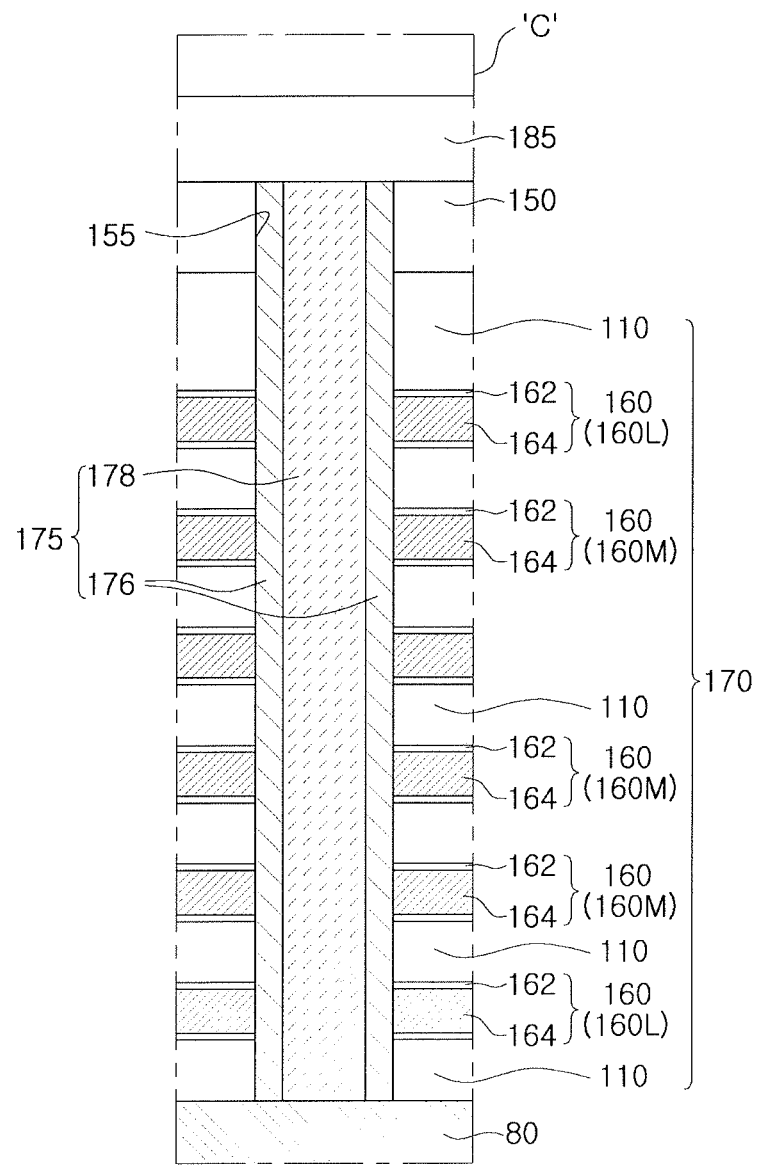
FIG. 8B illustrates a partially enlarged cross-sectional view of a modified example of a three-dimensional semiconductor device according to an example embodiment.

FIG. 8B is a partially enlarged cross-sectional view illustrating an enlarged region indicated by 'C' in FIG. 5.

In a modified example, referring to FIG. 8B, each of the separation structures 175 may include a separation spacer 176 and a separation core pattern 178. The separation spacer 176 may include an insulating material such as silicon oxide, or the like. The separation core pattern 178 may be formed of a conductive material including, for example, one or two or more among metal nitride (e.g., TiN or WN), metal (e.g., W), metal silicide (e.g., TiSi or WSi), or doped silicon.

Referring again to FIGS. 3A to 5, the plate portion 80 and the pattern portions 70 of the second substrate 60 may be in direct contact with each other and may be formed of different materials. The plate portion 80 may include a semiconductor layer, and the pattern portions 70 may be formed of a material of one or two or more among an insulating material, a doped semiconductor material, or a metallic material.

In an example, the pattern portions 70 may be formed of silicon nitride, and the plate portion 80 may be formed of a semiconductor layer.

In another example, the pattern portions 70 may be formed of polysilicon, and the plate portion 80 may be formed of a semiconductor layer forming an interface with the pattern portions 70.

Next, referring to FIGS. 9A to 12B, various examples of the second substrate 60 will be described. FIGS. 9A to 12B are partially enlarged cross-sectional views illustrating an enlarged region indicated by 'A' in FIG. 4.

Figure 9A:
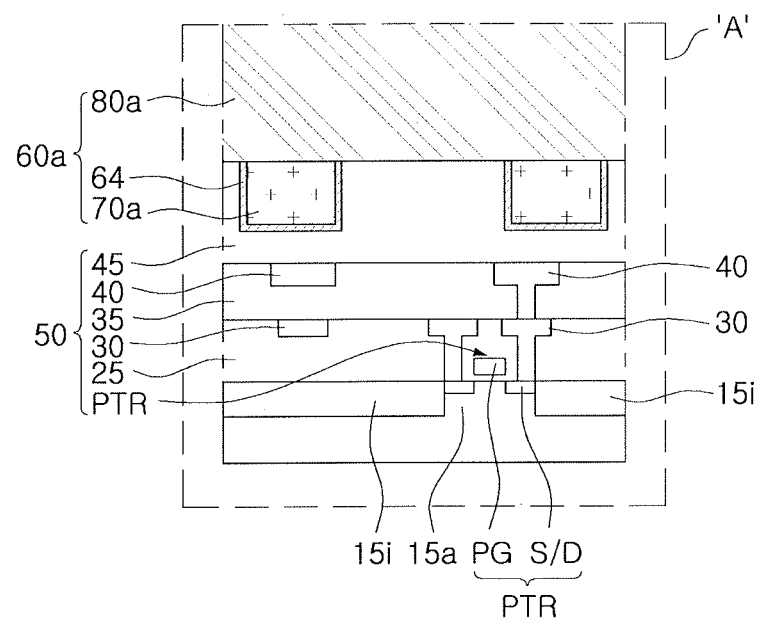
FIGS. 9A to 9C, FIGS. 10A to 10C, FIGS. 11A to 11C, and FIGS. 12A and 12B illustrate partially enlarged cross-sectional views of modified examples of a portion indicated by 'A' in FIG. 4.

In an example, referring to FIG. 9A, a second substrate 60a may include pattern portions 70a and a plate portion 80a on the pattern portions 70a. The plate portion 80a may be formed of a semiconductor layer, for example, a doped polysilicon layer. For example, the plate portion 80a may be formed of a polysilicon layer having N-type conductivity.

The second substrate 60a may further include a barrier layer 64 covering a side surface and a bottom surface of the pattern portions 70a. The barrier layer 64 may be formed of a conductive barrier layer such as Ti/TiN, or the like, while the pattern portions 70a may be formed of a metal material such as tungsten or the like having electrical resistance lower than that of a semiconductor layer of the plate portion 80a. Thus, the second substrate 60a may include the pattern portions 70a having low electrical resistance and the plate portion 80a having semiconductor characteristics. The second substrate 60a, described above, may improve electrical characteristics of the three-dimensional semiconductor device.

Figure 9B:
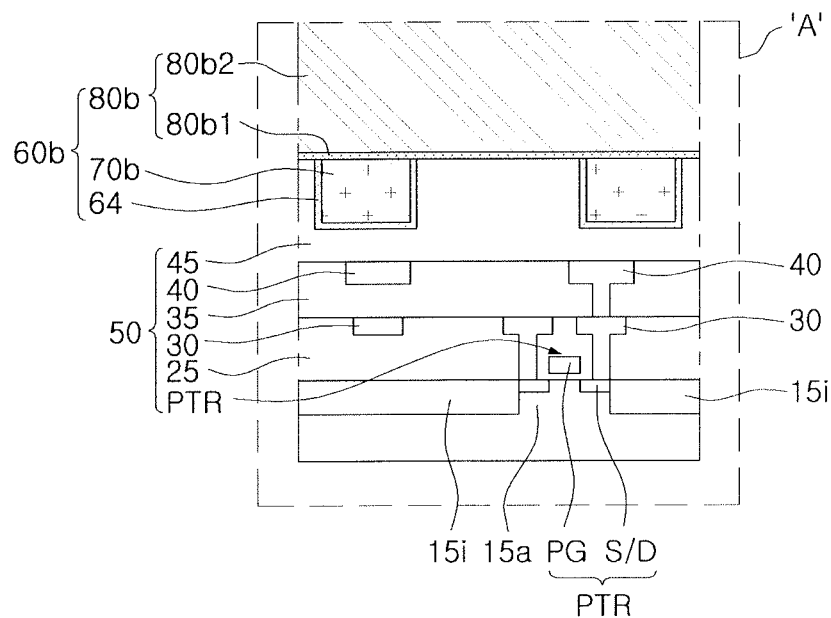

In a modified example, referring to FIG. 9B, a second substrate 60b may include pattern portions 70b, a barrier layer 64 covering a side surface and a bottom surface of the pattern portions 70b, and a plate portion 80b on the pattern portions 70b. The pattern portions 70b and the barrier layer 64 may be the same as the pattern portions 70a and the barrier layer 64, described with reference to FIG. 9A.

The plate portion 80b may include a first plate layer 80b1 and a second plate layer 80b2 on the first plate layer 80b1.

The second plate layer 80b2 may be a semiconductor layer. For example, the second plate layer 80b2 may be formed of a doped polysilicon layer. For example, the second plate layer 80b2 may be formed of a polysilicon layer having N-type conductivity.

The first plate layer 80b1 may be formed of a material capable of increasing adhesion between the second plate layer 80b2 and the pattern portions 70b, or improving electrical characteristics by lowering resistance between the second plate layer 80b2 and the pattern portions 70b. For example, the first plate layer 80b1 may include metal silicide such as WSi or TiSi and/or metal nitride such as TiN or TiSiN.

Figure 9C:
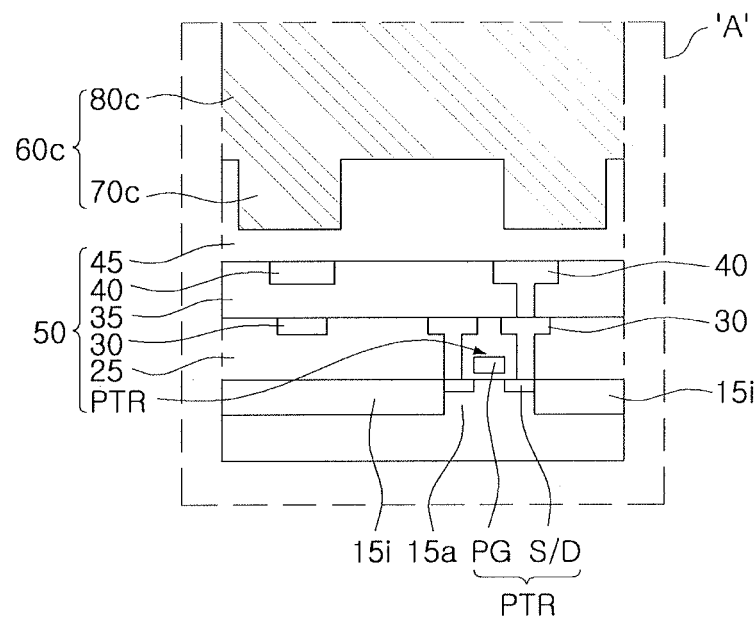

In a modified example, referring to FIG. 9C, a second substrate 60c may include pattern portions 70c and a plate portion 80c on the pattern portions 70c, while the pattern portions 70c and the plate portion 80c may have an integrated structure. For example, the pattern portions 70c and the plate portion 80c may be formed of a semiconductor layer. For example, the pattern portions 70c and the plate portion 80c may be formed of a polysilicon layer having N-type conductivity or P-type conductivity.

Figure 10A:
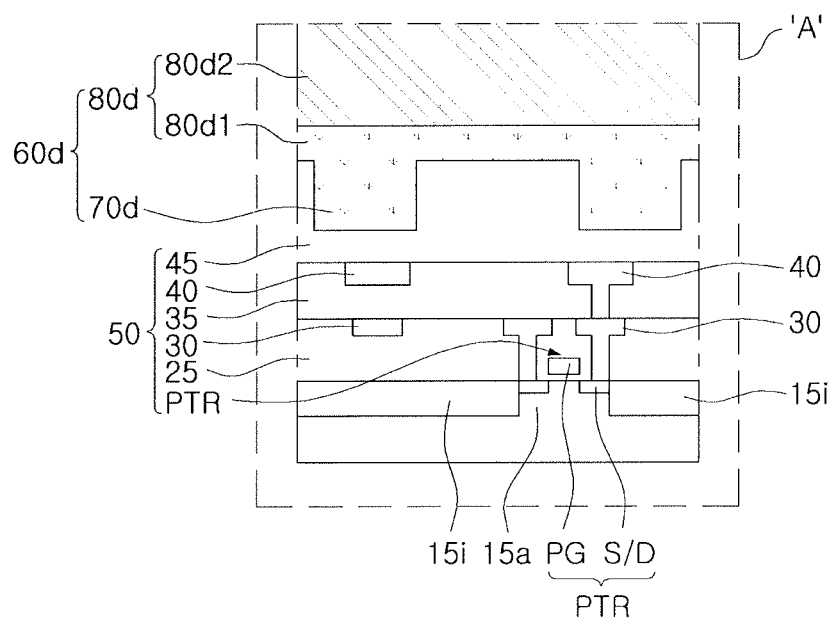

In a modified example, referring to FIG. 10A, a second substrate 60d may include pattern portions 70d and a plate portion 80d on the pattern portions 70d. The plate portion 80d may include a first plate layer 80d1 and a second plate layer 80d2 on the first plate layer 80d1.

The first plate layer 80d1 may have an integrated structure with the pattern portions 70d. Thus, the first plate layer 80d1 and the pattern portions 70d may be continuously connected to each other without boundaries and may be formed of the same material.

In an example, the first plate layer 80d1 and the pattern portions 70d may be formed of an insulating material, for example, silicon nitride.

In another example, the first plate layer 80d1 and the pattern portions 70d may be formed of a conductive material, for example, doped silicon or a metal material such as tungsten.

The second plate layer 80d2 may be a semiconductor layer. For example, the second plate layer 80d2 may be formed of a polysilicon layer having N-type conductivity or P-type conductivity.

Figure 10B:
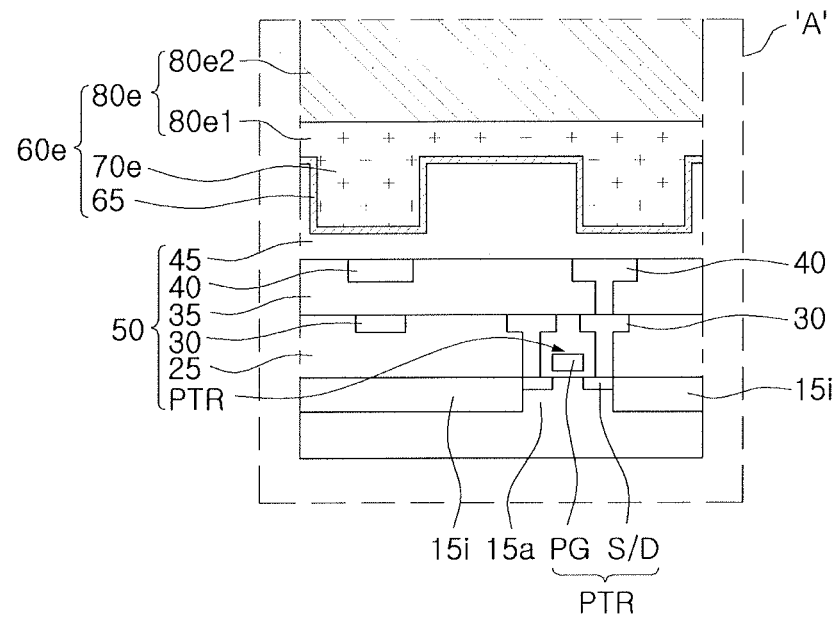

In a modified example, referring to FIG. 10B, a second substrate 60e may include pattern portions 70e and a plate portion 80e on the pattern portions 70e. The plate portion 80e may include a first plate layer 80e1 and a second plate layer 80e2 on the first plate layer 80e1.

The first plate layer 80e1 may have an integrated structure with the pattern portions 70e. For example, the first plate layer 80e1 and the pattern portions 70e may be formed of a conductive material.

The second plate layer 80e2 may be formed of a semiconductor layer. For example, the second plate layer 80e2 may be formed of a semiconductor layer having N-type conductivity, for example, polysilicon.

The second substrate 60e may further include a conductive barrier layer 65, extended between the first plate layer 80e1 and the lower structure 50 while covering a side surface and a bottom surface of the pattern portions 70e. The conductive barrier layer 65 may be formed of a conductive material such as Ti/TiN, or the like.

Figure 10C:
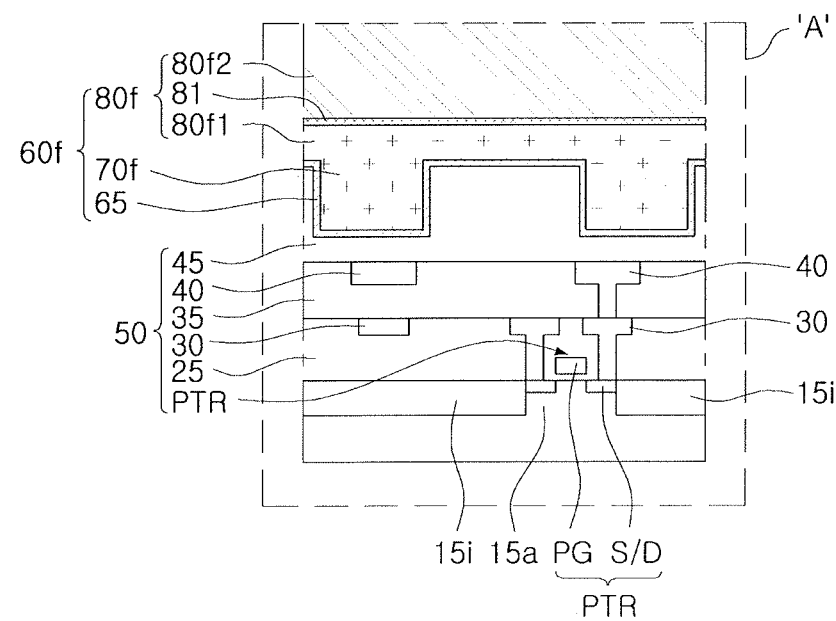

In a modified example, referring to FIG. 10C, a second substrate 60f may include pattern portions 70f, a plate portion 80f on the pattern portions 70f, and a barrier layer 65 extended between the plate portion 80f and the lower structure 50 while covering a side surface and a bottom surface of the pattern portions 70f.

The plate portion 80f may include a first plate layer 80f1, a second plate layer 80f2 on the first plate layer 80f1, and an additional conductive layer 81 between the first plate layer 80f1 and the second plate layer 80f2.

The first plate layer 80f1 and the pattern portions 70f may have an integrated structure. For example, the first plate layer 80f1 and the pattern portions 70f may be formed of a conductive material such as tungsten. The second plate layer 80f2 may be formed of a semiconductor layer. The additional conductive layer 81 may be formed of a material capable of increasing adhesion between the first plate layer 80f1 and the second plate layer 80f2, or improving electrical characteristics by lowering resistance between the first plate layer 80f1 and the second plate layer 80f2. For example, the additional conductive layer 81 may include one or two or more among metal silicide such as WSi or TiSi, metal nitride such as WN, TiN, or TiSiN, and metal such as Ti.

Figure 11A:
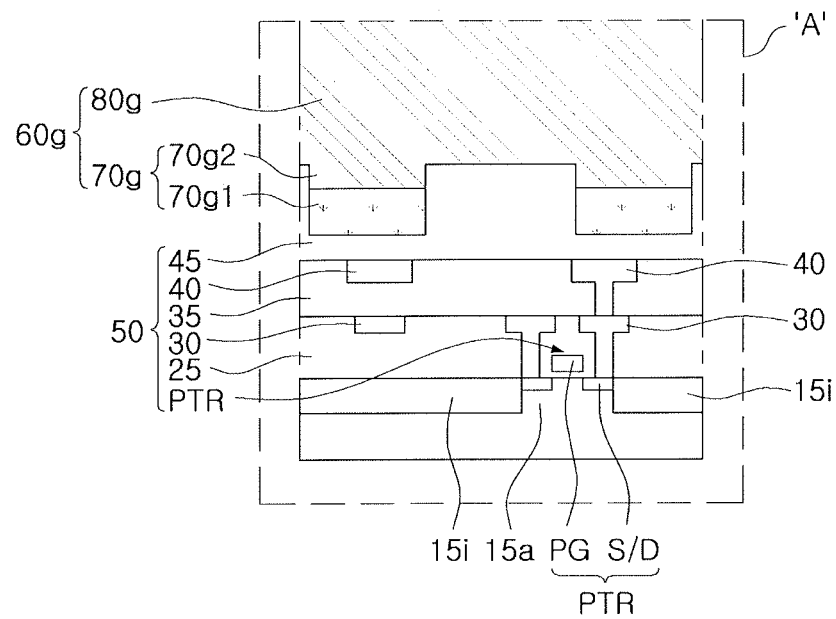

In a modified example, referring to FIG. 11A, a second substrate 60g may include pattern portions 70g and a plate portion 80g on the pattern portions 70g. Each of the pattern portions 70g may include a first pattern portion 70g1 and a second pattern portion 70g2 on the first pattern portion 70g1.

The plate portion 80g may have an integrated structure, continuously connected to the second pattern portion 70g2 without boundaries. Thus, the plate portion 80g and the second pattern portion 70g2 may be formed of the same material, for example, a semiconductor layer. The plate portion 80g may be formed of a semiconductor layer having N-type conductivity or P-type conductivity.

In an example, the first pattern portion 70g1 may be formed of an insulating material, for example, silicon nitride.

In another example, the first pattern portion 70g1 may be formed of a conductive material, for example, metal nitride such as TiN and/or metal such as W.

Figure 11B:
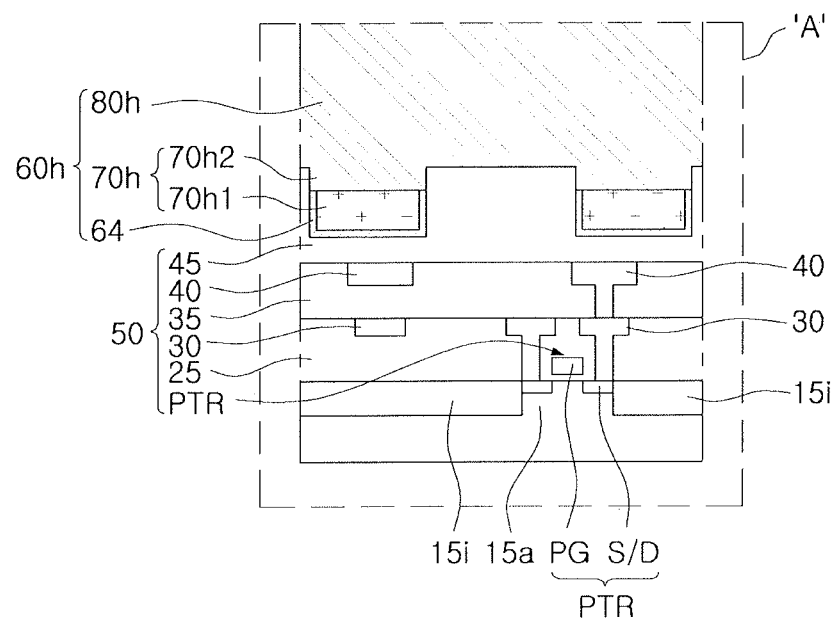

In a modified example, referring to FIG. 11B, a second substrate 60h may include pattern portions 70h and a plate portion 80h on the pattern portions 70h. Each of the pattern portions 70h may include a first pattern portion 70h1 and a second pattern portion 70h2 on the first pattern portion 70h1.

The second substrate 60h may further include a barrier layer 64 covering a side surface and a bottom surface of the first pattern portion 70h1.

The plate portion 80h may have an integrated structure, continuously connected to the second pattern portion 70h2 without boundaries. The plate portion 80g may be formed of a semiconductor layer having N-type conductivity or P-type conductivity.

The first pattern portion 70h1 may be formed of metal such as W, and the barrier layer 64 may be formed of a conductive material such as Ti/TiN.

Figure 11C:
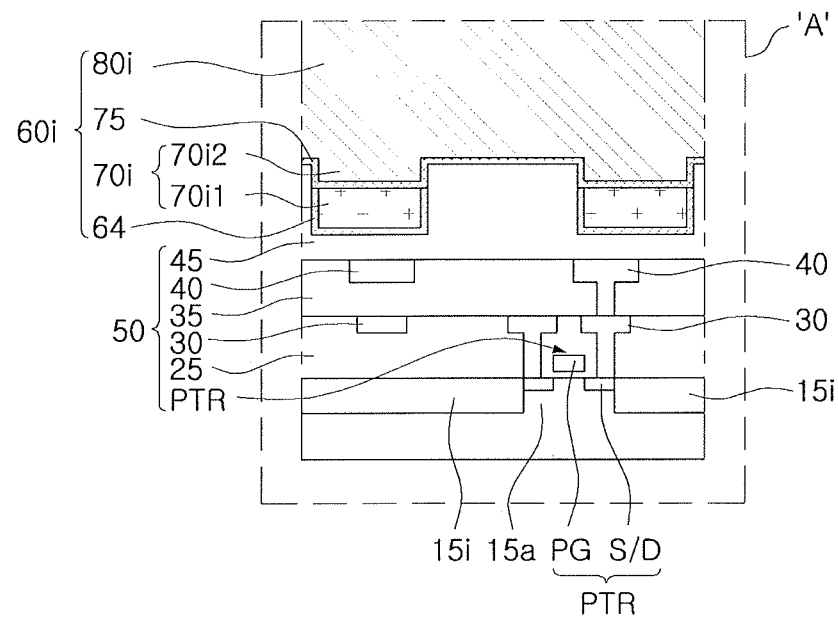

In a modified example, referring to FIG. 11C, a second substrate 60i may include pattern portions 70i and a plate portion 80i on the pattern portions 70i. Each of the pattern portions 70i may include a first pattern portion 70i1 and a second pattern portion 70i2 on the first pattern portion 70i1.

The plate portion 80i may have an integrated structure, continuously connected to the second pattern portion 70i2 without boundaries. The plate portion 80i may be formed of a semiconductor layer having N-type conductivity or P-type conductivity.

The second substrate 60i may further include a barrier layer 64 covering a side surface and a bottom surface of the first pattern portion 70i1. The barrier layer 64 may be formed of a conductive material such as Ti/TiN, or the like.

The second substrate 60i may further include an additional conductive layer 75, extended between the plate portion 80i and the lower structure 50 while covering a side surface and a bottom surface of the second pattern portion 70i2. The additional conductive layer 75 may include one or two or more among metal silicide such as WSi or TiSi, metal nitride such as WN, TiN, or TiSiN, and metal such as Ti.

Figure 12A:
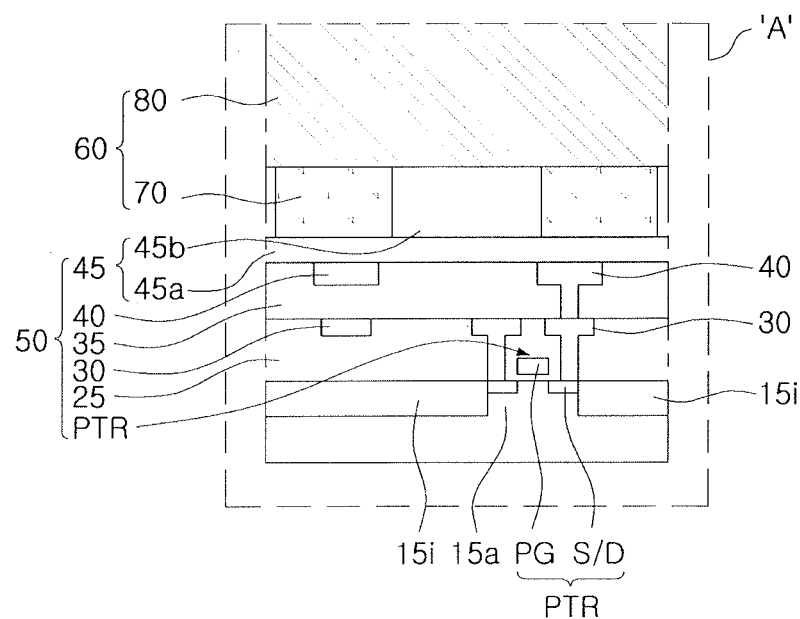

In a modified example, referring to FIG. 12A, as described above, the second substrate 60 may include the pattern portions 70 and the plate portion 80 on the pattern portions 70.

The third interlayer insulating layer 45 of the lower structure 50 may include a lower insulating portion 45a and an upper insulating portion 45b. The lower insulating portion 45a may be disposed below a lower surface of the pattern portions 70, and the upper insulating portion 45b may be between side surfaces of the pattern portions 70.

Figure 12B:
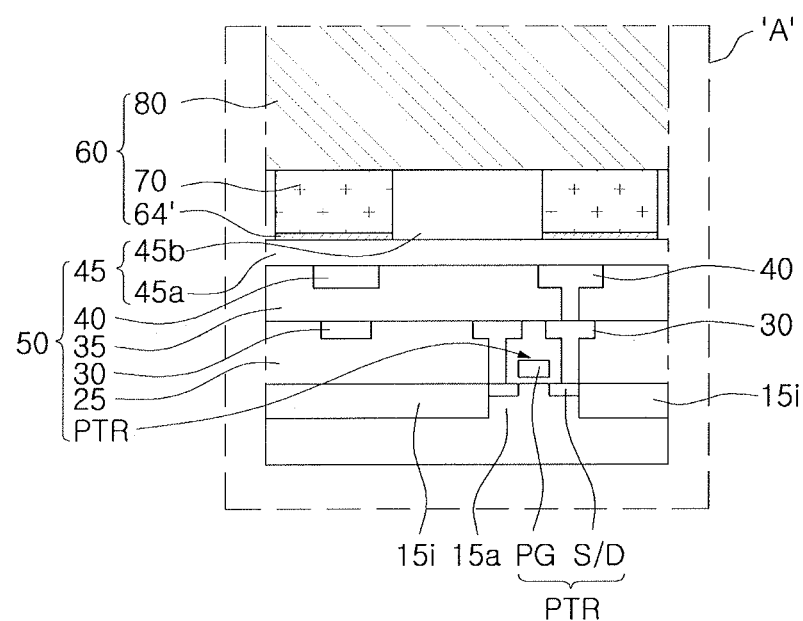

In a modified example, referring to FIG. 12B, a second substrate 60j may include pattern portions 70, the plate portion 80 on the pattern portions 70, and barrier layers 64' covering a lower surface of the pattern portions 70.

The third interlayer insulating layer 45 of the lower structure 50 may include a lower insulating portion 45a and an upper insulating portion 45b. The upper insulating portion 45b may cover side surfaces of the barrier layers 64' and the pattern portions 70, sequentially stacked, and the lower insulating portion 45a may be disposed below the barrier layers 64'.

Next, with reference to FIG. 13, a modified example of a three-dimensional semiconductor device according to an example embodiment will be described.

Figure 13:
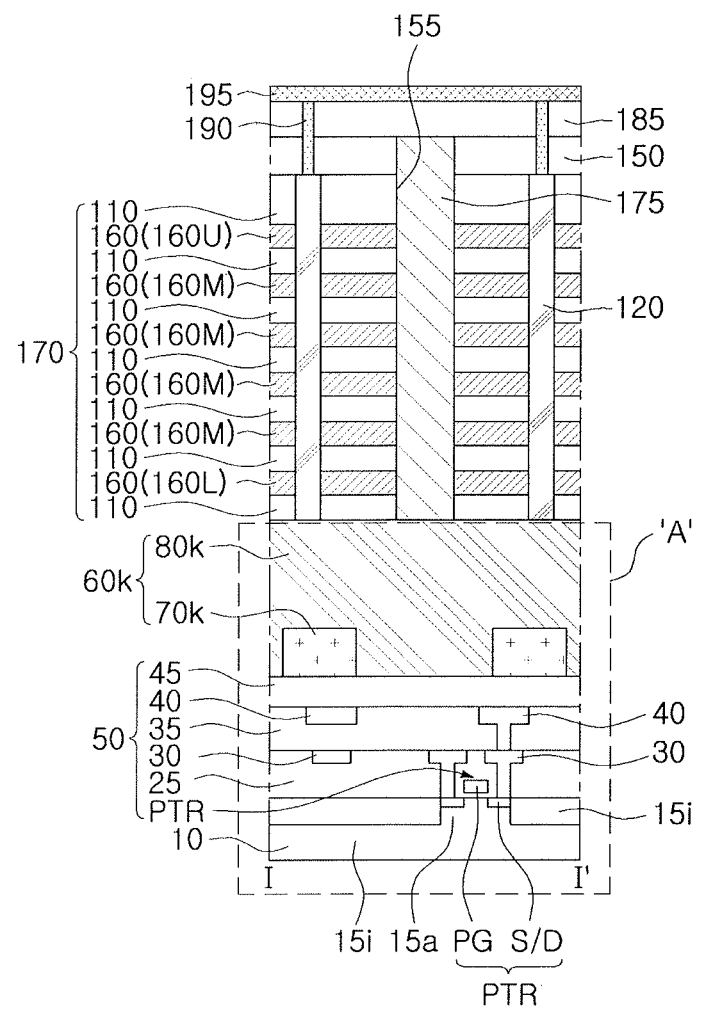
FIG. 13 illustrates a cross-sectional view of a modified example of a three-dimensional semiconductor device according to an example embodiment.

Referring to FIG. 13, as described above, a lower structure 50 may be on a first substrate 10, and a second substrate 60k may be on the lower structure 50. The first substrate 10 may be a semiconductor substrate, and the lower structure 50 may include the peripheral transistor PTR, the peripheral wirings 30 and 40, and the first to third lower insulating layers 25, 35, and 45, described above. On the second substrate 60k, the stacked structure 170, the vertical structures 120, and the bit lines 195, described with reference to FIGS. 3A to 5, may be disposed.

The second substrate 60k may include pattern portions 70k and a plate portion 80k.

In an example, the plate portion 80k may cover an upper surface and a side surface of the pattern portions 70k.

In an example, the plate portion 80k may include a polycrystalline semiconductor layer. For example, the plate portion 80k may be formed of a polysilicon layer having N-type conductivity or P-type conductivity.

In an example, the pattern portions 70k may be formed of an insulating material, for example, silicon nitride. In another example, the pattern portions 70k may include a conductive material, for example, a metal nitride such as TiN and/or a metal such as W.

As described above, various modified examples of the pattern portions 70k and the plate portion 80k, covering an upper surface and a side surface of the pattern portions 70k, will be described with reference to FIGS. 14A and 14B.

Figure 14A:
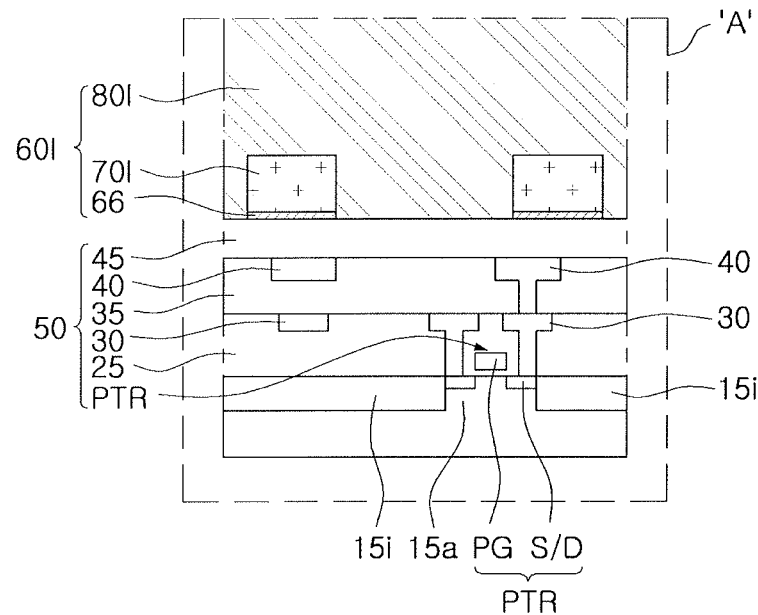
FIGS. 14A and 14B illustrate partially enlarged cross-sectional views of modified examples of a three-dimensional semiconductor device according to an example embodiment.
Figure 14B:
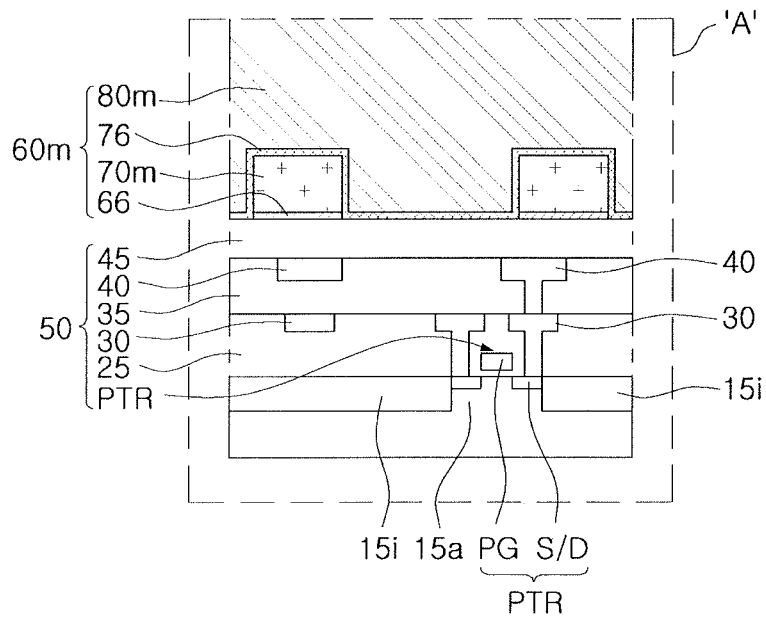

FIGS. 14A to 14B are partially enlarged cross-sectional views illustrating an enlarged region indicated by 'A' in FIG. 13.

In a modified example, referring to FIG. 14A, a second substrate 60*l* may include pattern portions 70*l* and a plate portion 80*l*. The second substrate 60*l* may further include barrier layers 66 disposed below the pattern portions 70*l*. The plate portion 80*l* may cover an upper surface of the pattern portions 70*l* while covering side surfaces of the barrier layers 66 and the pattern portions 70*l*, sequentially stacked. The barrier layers 66 may be formed of a conductive material such as Ti/TiN, or the like.

In a modified example, referring to FIG. 14B, a second substrate 60*m* may include pattern portions 70*m* and a plate portion 80*m*. The second substrate 60*m* may further include barrier layers 66 disposed below the pattern portions 70*m*, and an additional conductive layer 76 interposed between the pattern portions 70*m* and the plate portion 80*m* and extended between the plate portion 80*m* and the lower structure 50. The additional conductive layer 76 may include one or two or more among a metal silicide such as WSi or TiSi, a metal nitride such as WN, TiN, or TiSiN, and a metal such as Ti.

Figure 15:
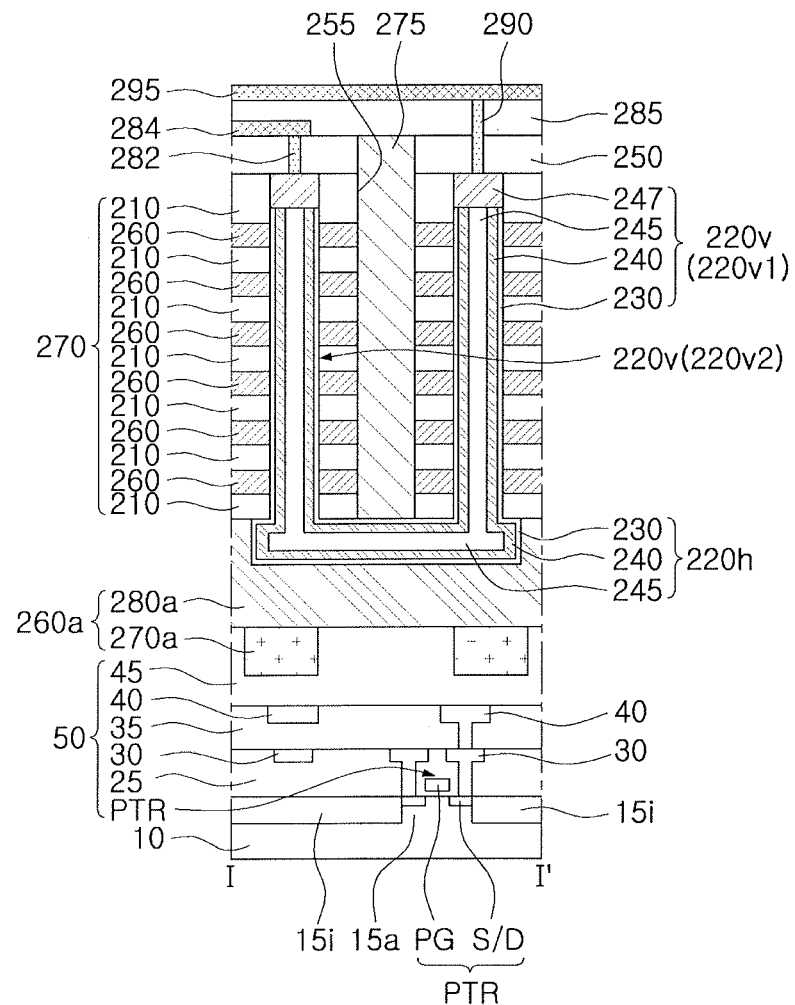
FIG. 15 illustrates a cross-sectional view of a modified example of a three-dimensional semiconductor device according to an example embodiment.
Figure 16:
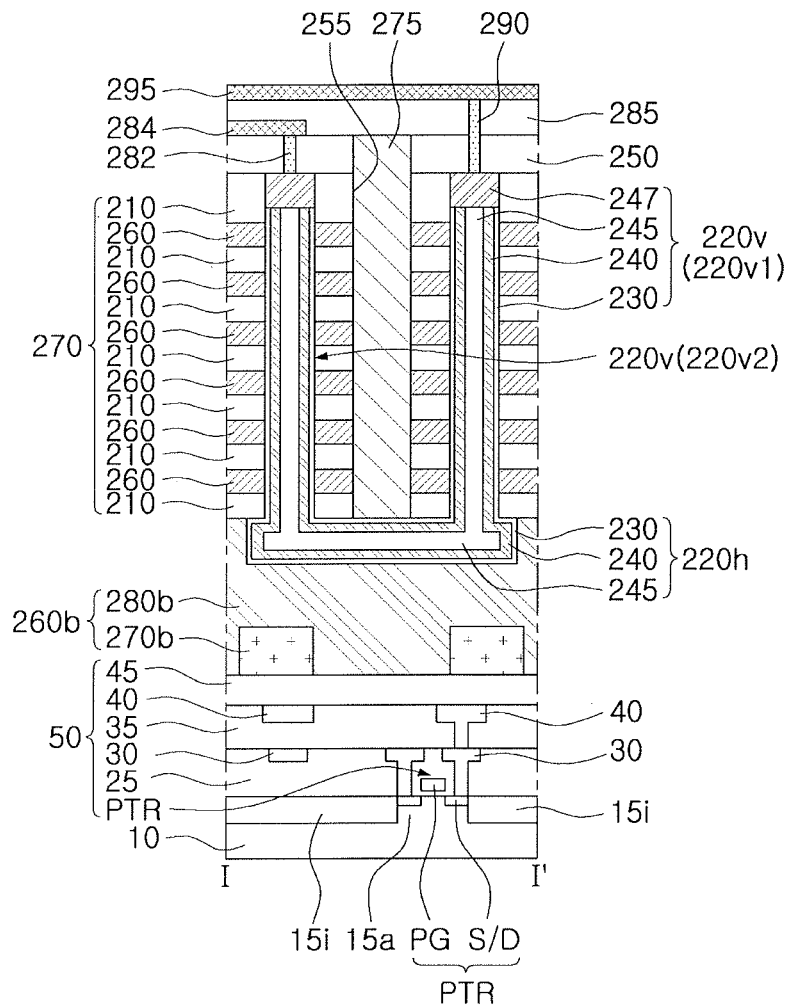
FIG. 16 illustrates a cross-sectional view of a modified example of a three-dimensional semiconductor device according to an example embodiment.

Next, with reference to FIGS. 15 and 16, modified examples of a three-dimensional semiconductor device according to an example embodiment will be described. FIGS. 15 and 16 are schematic cross-sectional views illustrating a region taken along line I-I' of FIGS. 3A and 3B.

In a modified example, referring to FIG. 15, the lower structure 50 may be on the first substrate 10, described above. A second substrate 260*a*, including pattern portions 270*a* and a plate portion 280*a* connected to the pattern portions 270*a* while covering an upper surface of the pattern portions 270*a*, may be on the lower structure 50.

The second substrate 260*a* may be the same as the second substrate 60 described with reference to FIGS. 3A to 5. Further, the second substrate 260*a* may be modified as second substrates 60*a* to 60*j* according to various modified examples, described with reference to FIGS. 9A to 12B. Thus, the second substrate 260*a* may be understood to be the same as those described with reference to FIGS. 3A to 12B, so a detailed description thereof will not be repeated.

A stacked structure 270 may be on the second substrate 260*a*. The stacked structure 270 may include interlayer insulating layers 210 and horizontal conductive patterns 260, alternately and repeatedly stacked.

A first capping insulating layer 250 and a second capping insulating layer 285, sequentially stacked, may be on the stacked structure 270. A separation structure 275 may be disposed in a separation trench 255, passing through the first capping insulating layer 250 and the stacked structure 270. The separation structure 275 may be formed of an insulating material such as silicon oxide, or the like.

Vertical structures 220*v*, passing through the stacked structure 270, may be provided.

Each of the vertical structures 220*v* may include an insulating core pattern 245 passing through the stacked structure 270, a channel semiconductor layer 240 surrounding an outer side surface of the insulating core pattern 245, a gate dielectric structure 230 surrounding an outer side surface of the channel semiconductor layer 240, and a pad pattern 247 on the channel semiconductor layer 240 and the insulating core pattern 245. The channel semiconductor layer 240, the insulating core pattern 245, and the pad pattern 247 may be formed of a material the same as that of the channel semiconductor layer 140, the insulating core pattern 145, and the pad pattern 147, described with reference with FIG. 7. In an example, the gate dielectric structure 230 may be formed of a material and a structure, the same as the gate dielectric structure 130, described with reference to FIG. 7.

The vertical structures 220*v* may include a first vertical structure 220*v*1 and a second vertical structure 220*v*2, located on both sides of the separation structure 275.

A horizontal connection structure 220*h*, extended from the first vertical structure 220*v*1 and the second vertical structure 220*v*2 and disposed in the plate portion 280*a* of the second substrate 260*a* below the separation structure 275, may be provided. The gate dielectric structure 230, the channel semiconductor layer 240, and the insulating core pattern 245, of the first vertical structure 220*v*1 and the second vertical structure 220*v*2, are extended from the first vertical structure 220*v*1 and the second vertical structure 220*v*2, downwardly of the separation structure 275, and thus a horizontal connection structure 220*h* may be provided.

The plate portion 280*a* may be formed of a semiconductor layer having N-type conductivity, for example, polysilicon having N-type conductivity. The plate portion 280*a* may be a back gate electrode.

A source line 284 may be on the first capping insulating layer 250. A source contact plug 282, electrically connecting the source line 284 to the second vertical structure 220*v*2, may be between the source line 284 and the second vertical structure 220*v*2.

A bit line 295 may be on the second capping insulating layer 285. A bit line contact plug 290, electrically connecting the bit line 295 to the first vertical structure 220*v*1, may be between the bit line 295 and the first vertical structure 220*v*1.

In a modified example, referring to FIG. 16, the lower structure 50 may be on the first substrate 10, described above. A second substrate 260*b*, including pattern portions 270*b* and a plate portion 280*b* connected to the pattern portions 270*b* while covering an upper surface and a side surface of the pattern portions 270*b*, may be on the lower structure 50.

The second substrate 260*b* may be the same as the second substrate 60*k* described with reference to FIG. 13. Further, the second substrate 260*b* may be modified as second substrates 60*l* and 60*m* according to various modified examples, described with reference to FIGS. 14A and 14B. Thus, the second substrate 260*b* may be understood to be the same as those described with reference to FIGS. 13 to 14B, so a detailed description thereof will not be repeated.

On the second substrate 260*b*, as described with reference to FIG. 15, the stacked structure 270, the separation structure 275, the vertical structures 220*v*, the source line 284, and the bit line 295 may be disposed.

Referring again to FIGS. 3A to 5, as described above, in an example, the second substrate 60 may include pattern portions 70 extended in a first direction X, the connection portion 62 connecting the pattern portions 70 and having an integrated structure with the pattern portions 70, and the plate portion 80 overlapping the pattern portions 70 and the connection portion 62.

In an example, the pattern portions 70 and the separation structures 175 may have linear shapes, extended in the same direction, for example, the first direction X. Next, referring to FIGS. 17 to 21, various modified examples of the second substrate 60 will be described. Hereinafter, when described with reference to FIGS. 17 to 21, a structure on the second substrate may be the same as that described with reference to FIGS. 3A to 5. Thus, modified examples of the second substrate in FIG. 3A may be described with reference to FIGS. 17 to 21, while a structure on a second substrate, which may be modified, may be described with reference to FIGS. 3B to 5.

Figure 17:
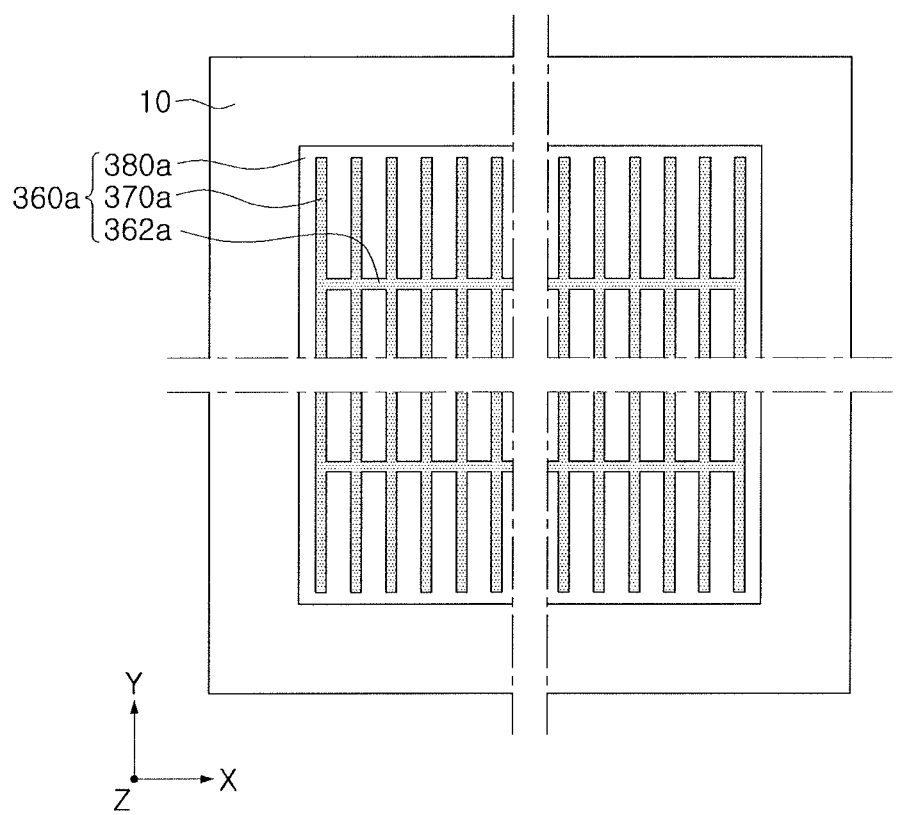
FIGS. 17 to 21 illustrate plan views of various modified examples of a three-dimensional semiconductor device according to an example embodiment.

In a modified example, referring to FIG. 17, with FIGS. 3B to 5, a second substrate 360a may include pattern portions 370a having a linear shape, a connection portion 362a formed integrally with the pattern portions 370a while connecting the pattern portions 370a, and a plate portion 380a covering the pattern portions 370a and the connection portion 362a.

The pattern portions 370a and the separation structures (175 of FIG. 3B) may have linear shapes extended in directions perpendicular to each, other. For example, the separation structure 175 may have a linear shape extended in a first direction X, while the pattern portions 70 may have a linear shape extended in a second direction Y, perpendicular to the first direction X. At least one of the pattern portions 370a has a linear shape extended in the first direction X. At least one of the horizontal conductive patterns (160 of FIG. 4) has a linear shape extended in the second direction Y. The pattern portions 370a and the horizontal conductive patterns (160 of FIG. 4) may have linear shapes extended in directions perpendicular to each other.

Figure 18:
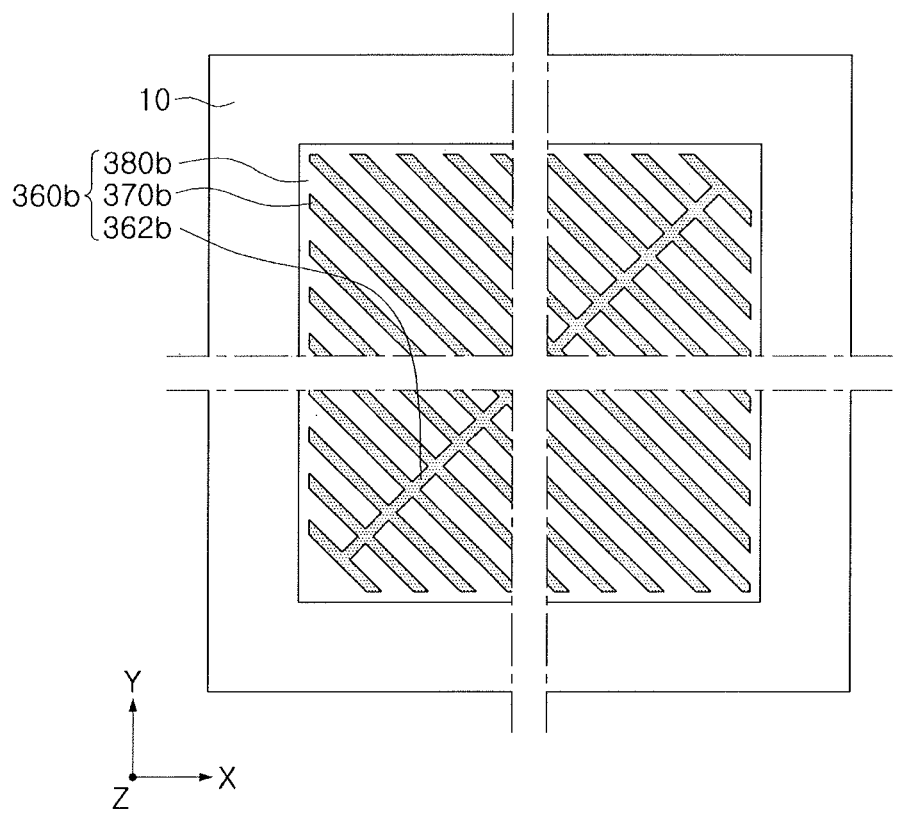

In a modified example, referring to FIG. 18, with FIGS. 3B to 5, a second substrate 360b may include pattern portions 370b having a linear shape, a connection portion 362b formed integrally with the pattern portions 370b while connecting the pattern portions 370b, and a plate portion 380b covering the pattern portions 370b and the connection portion 362b.

The pattern portions 370b and the separation structures (175 of FIG. 3B) may have linear shapes crossing each other diagonally.

Figure 19:
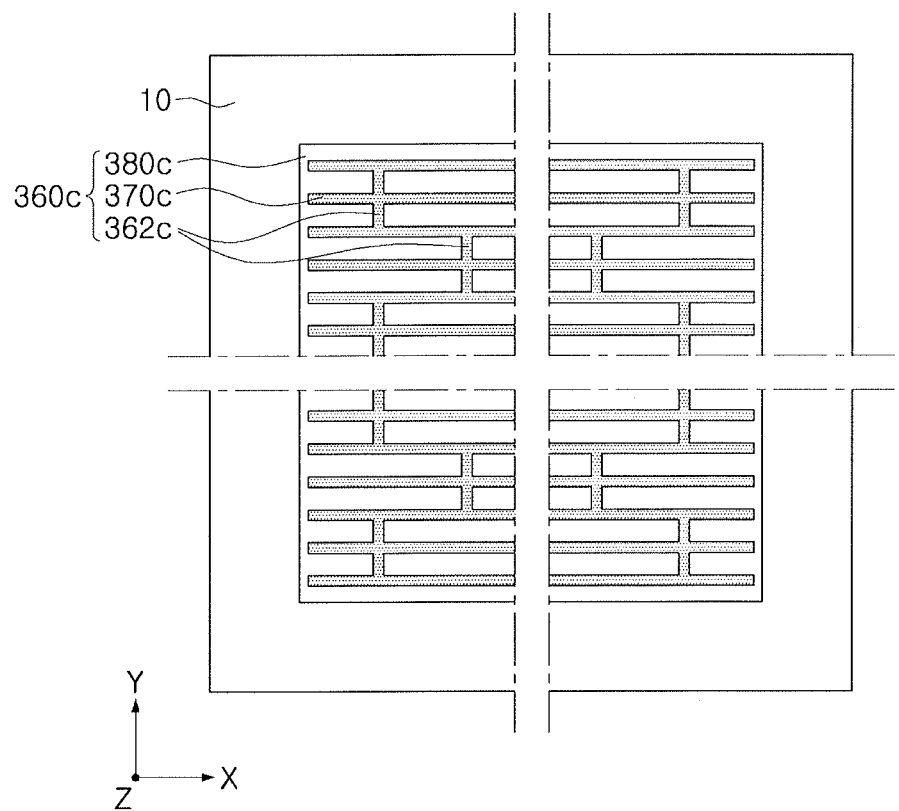

In a modified example, referring to FIG. 19, with FIGS. 3B to 5, a second substrate 360c may include pattern portions 370c having a linear shape, a connection portion 362c formed integrally with the pattern portions 370c while connecting the pattern portions 370c, and a plate portion 380c covering the pattern portions 370c and the connection portion 362c.

The connection portion (362a of FIG. 17), described above, may have a linear shape, continuously connected in one direction. In another example, as illustrated in FIG. 19, the connection portion 362c may have a bar shape extended in a direction perpendicular to the pattern portions 370c. The connection portion 362c having a bar shape, described above, may be provided as a plurality of connection portions, and the plurality of connection portions 362c may be spaced apart from each other in the first direction X, and may be spaced apart from each other in the second direction Y.

Figure 20:
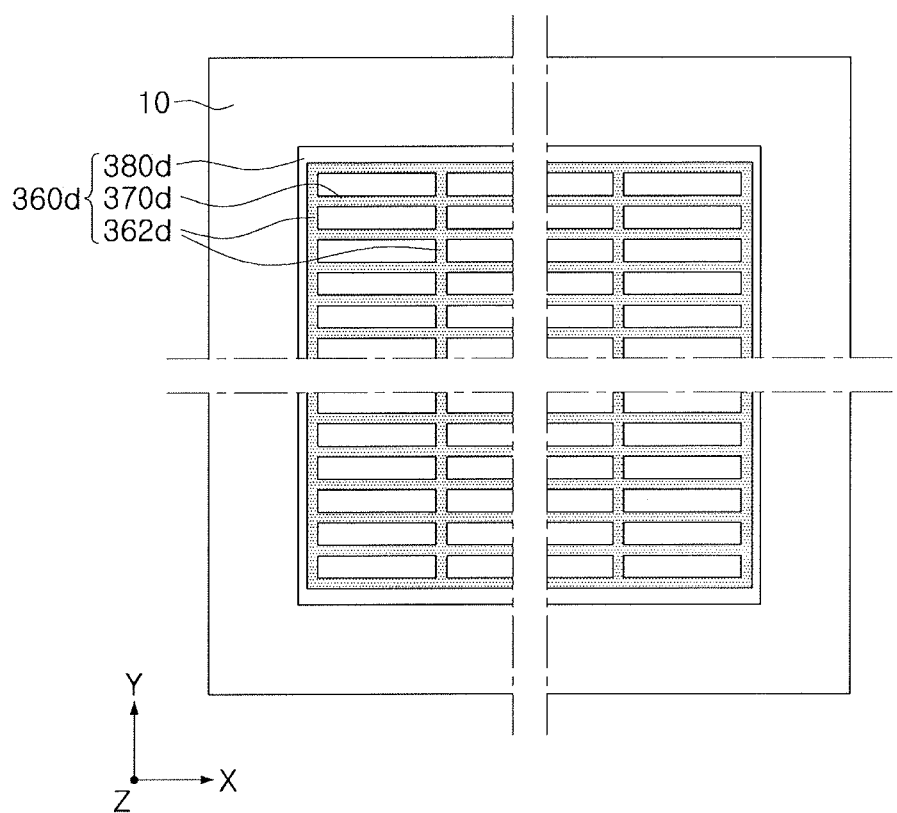

In a modified example, referring to FIG. 20, with FIGS. 3B to 5, a second substrate 360d may include pattern portions 370d having a linear shape, a connection portion 362d formed integrally with the pattern portions 370d while connecting the pattern portions 370d, and a plate portion 380d covering the pattern portions 370d and the connection portion 362d. The pattern portions 370d and the connection portion 362d may be arranged in a mesh shape.

Figure 21:
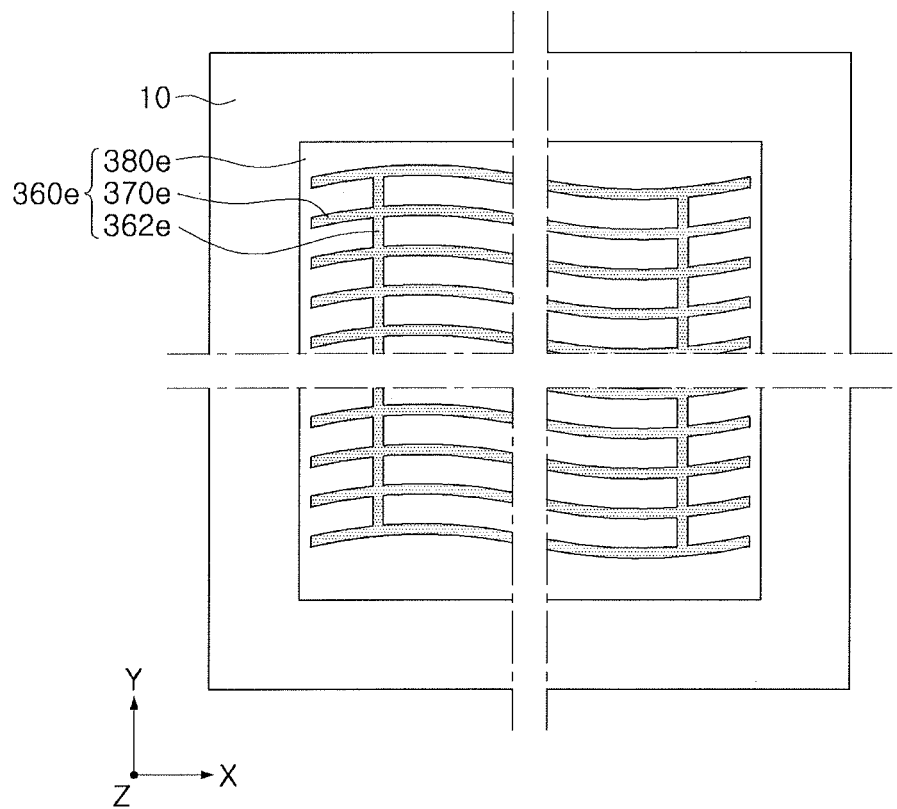

In a modified example, referring to FIG. 21, with FIGS. 3B to 5, a second substrate 360e may include pattern portions 370e, a connection portion 362e formed integrally with the pattern portions 370e while connecting the pattern portions 370e, and a plate portion 380e covering the pattern portions 370e and the connection portion 362e.

The pattern portions 370a to 370c, described above, may have a straight line shape. In another example, as illustrated in FIG. 21, the pattern portions 370e may have a bent shape or a curved shape.

Figure 22:
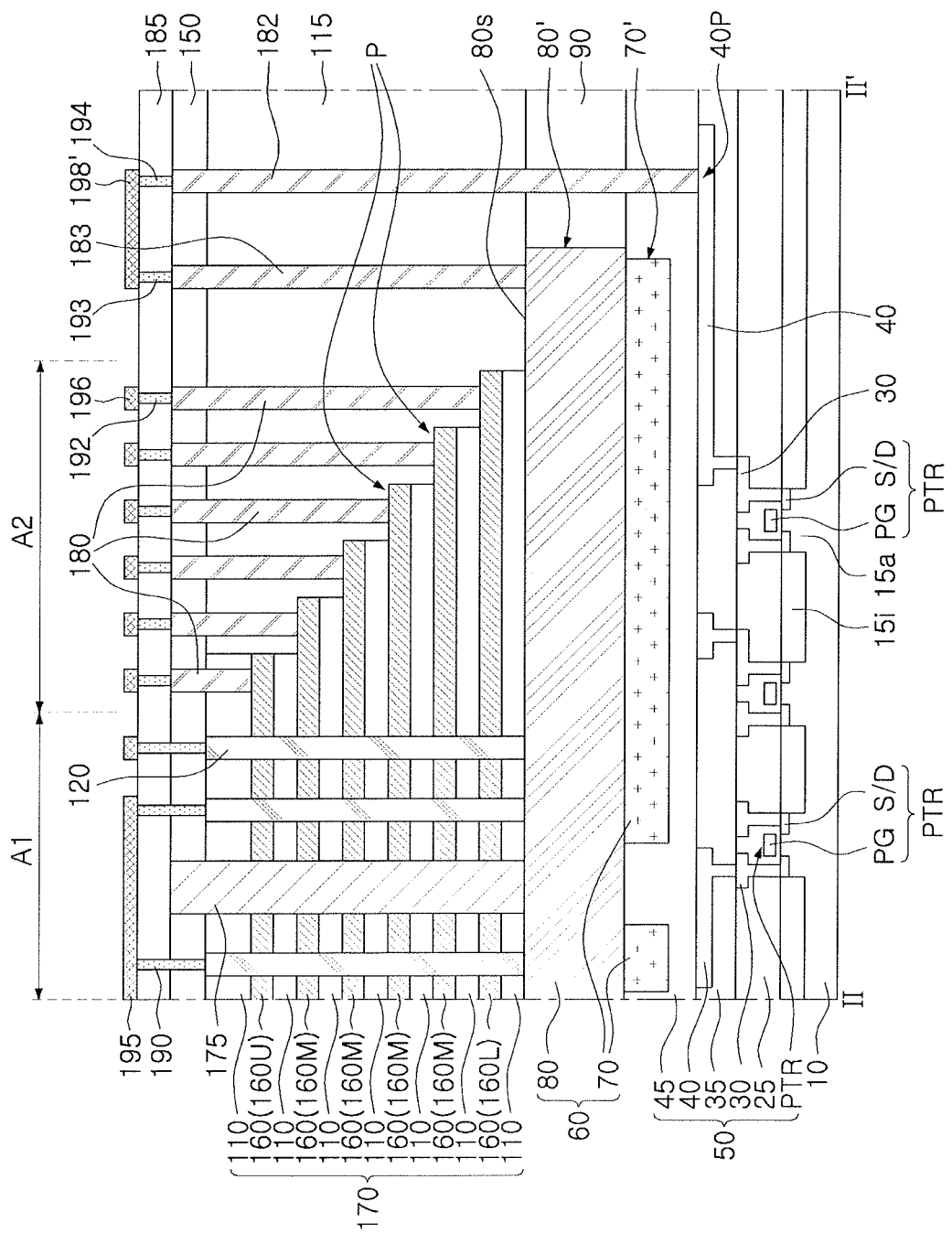
FIG. 22 illustrates a cross-sectional view of a modified example of a three-dimensional semiconductor device according to an example embodiment.

Next, with reference to FIG. 22, a modified example of a three-dimensional semiconductor device according to an example embodiment will be described. FIG. 22 is a cross-sectional view illustrating a region taken along line II-II' of FIGS. 3A and 3B.

Referring to FIG. 22, with FIGS. 3A, 3B, and 4, as described with reference to FIGS. 3A to 5, the lower structure 50 may be on the first substrate 10, and the second substrate 60 may be on the lower structure 50. As described with reference to FIGS. 3A to 5, the lower structure 50 may include the peripheral transistor PTR, the peripheral wirings 30 and 40, and the first to third lower insulating layers 25, 35, and 45. Moreover, on the second substrate 60, the stacked structure 170, the upper insulating layer 115, the first second capping insulating layer 150 and the second capping insulating layer 185, the vertical structures 120, the gate contact structures 180, the bit line contact plugs 190, the gate contact plugs 192, the peripheral contact plug 194, the gate connection wirings 196, and the bit lines 195, described with reference to FIGS. 3A to 5, may be disposed.

In an example, the plate portion 80 may include a semiconductor layer having N-type conductivity. Thus, the plate portion 80 may serve as the common source line CSL, described with reference to FIGS. 1A and 1B. A source contact structure 183 may be on the plate portion 80, which may be the common source line (CSL of FIGS. 1A and 1B) described above. A source contact plug 193 may be on the source contact structure 183. A peripheral connection wiring 198', electrically connected to the source contact plug 193 and the peripheral contact plug 194 simultaneously, may be on the second capping insulating layer 185.

Thus, the plate portion 80 may be electrically connected to the peripheral wirings 40, configuring a peripheral circuit in the lower structure 50 below the second substrate 60, through the peripheral connection wiring 198'. A modified example, in which the plate portion 80 and the peripheral wirings 40, configuring a peripheral circuit in the lower structure 50, are electrically connected to each other will be described with reference to FIGS. 23 and 24.

Figure 23:
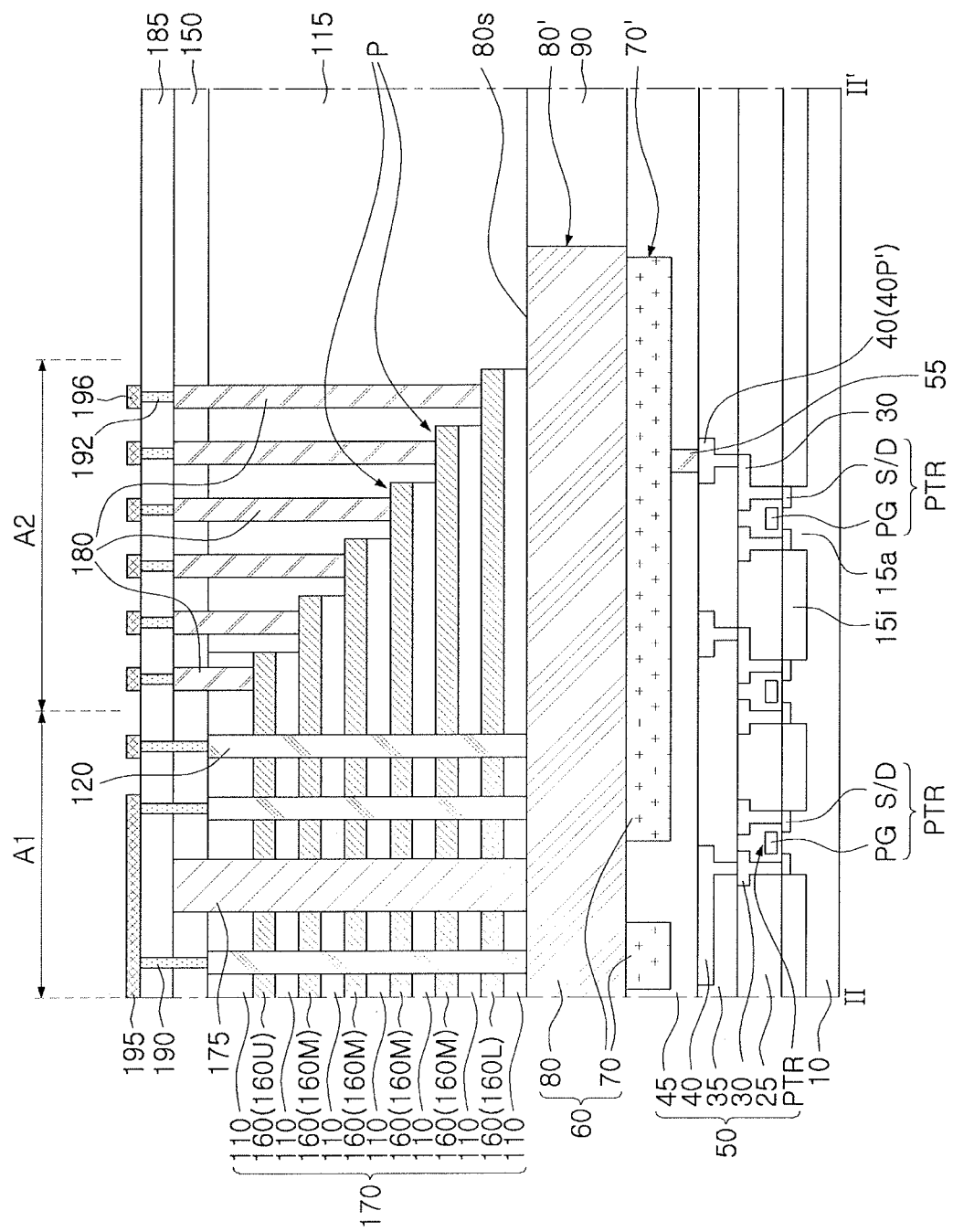
FIG. 23 illustrates a cross-sectional view of a modified example of a three-dimensional semiconductor device according to an example embodiment.
Figure 24:
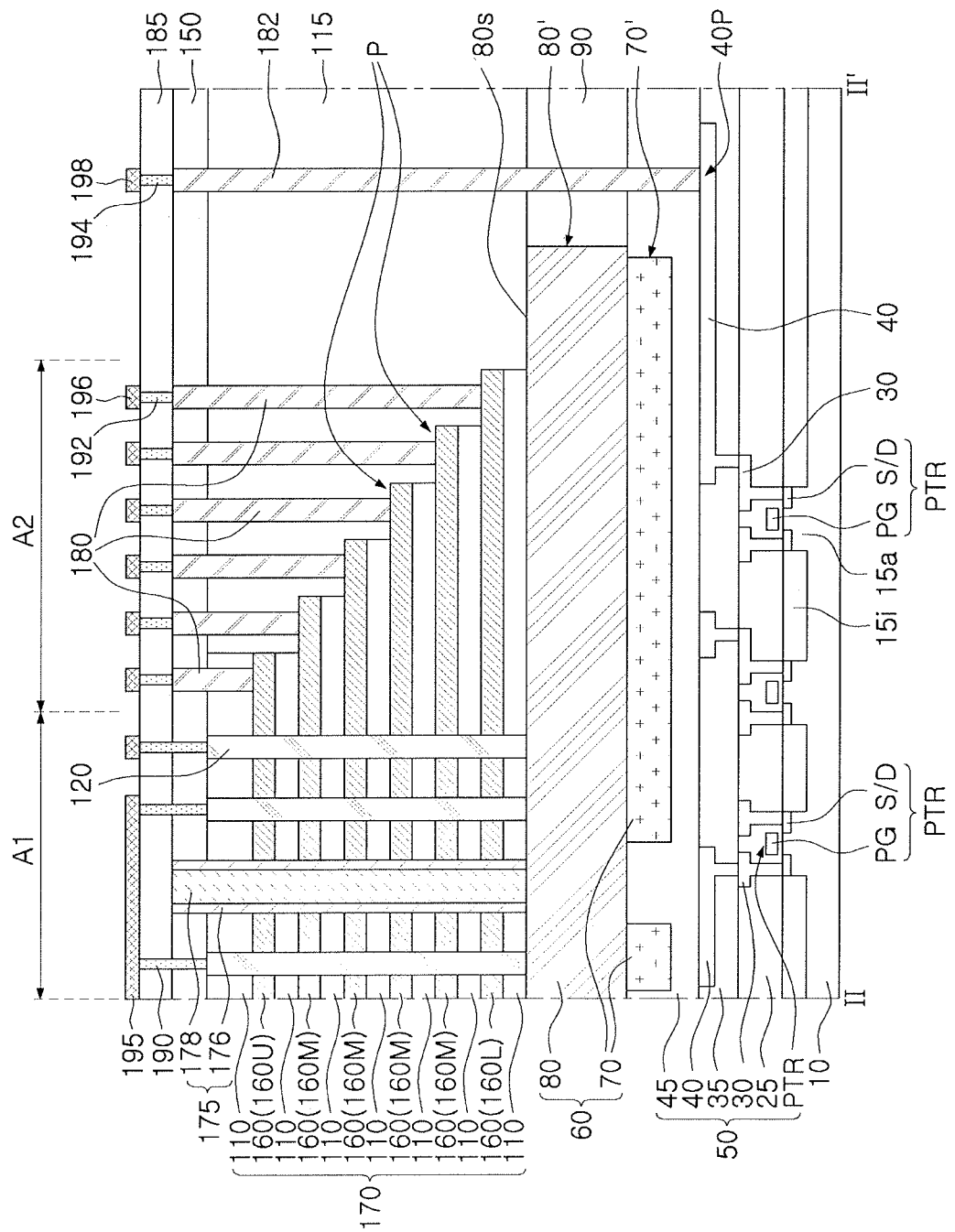
FIG. 24 illustrates a cross-sectional view of a modified example of a three-dimensional semiconductor device according to an example embodiment.

FIGS. 23 and 24 are cross-sectional views illustrating a region taken along line II-II' of FIGS. 3A and 3B.

In a modified example, referring to FIG. 23, the plate portion 80 of the second substrate 60, described above, may be a semiconductor layer having N-type conductivity, while the pattern portions 70 may be formed of a conductive material (e.g., TiN, W, doped polysilicon, or the like). A contact plug 55, interposed between the pattern portions 70 of the second substrate 60 and the peripheral pad region 40P' of the peripheral wirings 30 and 40, and electrically connecting the pattern portions 70 to the peripheral pad region 40P' of the peripheral wirings 30 and 40, may be provided. Thus, the plate portion 80 of the second substrate 60 may include a semiconductor layer having N-type conductivity, and the plate portion 80 may serve as the common source line CSL, described with reference to FIGS. 1A and 1B. The plate portion 80 may be electrically connected to the peripheral wirings 40, configuring a peripheral circuit in the lower structure 50 below the second substrate 60, through the contact plug 55.

In a modified example, referring to FIG. 24, the plate portion 80 of the second substrate 60, described above, may be a semiconductor layer having N-type conductivity or P-type conductivity, or including a portion having N-type conductivity or a portion having P-type conductivity, while the pattern portions 70 may be formed of a conductive material (e.g., TiN, W, doped polysilicon, or the like) or an insulating material (e.g., SiN, or the like). In this case, the separation structure 175 may include a separation core pattern 178, formed of a conductive material, and a separation spacer 176, on a side surface of the separation core pattern 178 and separating the separation core pattern 178 from the stacked structure 170. The separation spacer 176 may be formed of an insulating material. The separation core pattern 178, in the separation structure 175, may be electrically connected to a semiconductor layer having N-type conductivity of the plate portion 80, which may be the common source line CSL illustrated in FIGS. 1A and 1B.

Next, with reference to FIGS. 25 to 29, an example of a method for forming a three-dimensional semiconductor device according to an example embodiment will be described.

Figure 25:
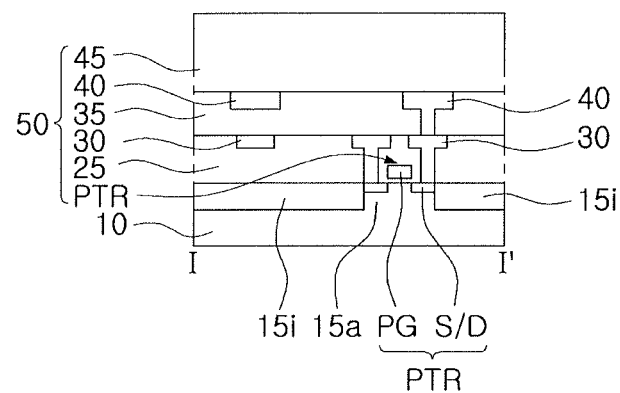
FIGS. 25 to 29 illustrate cross-sectional views of an example of a method for forming a three-dimensional semiconductor device according to an example embodiment.
Figure 26:
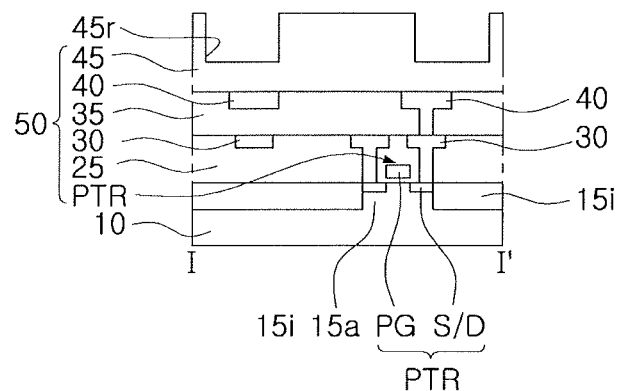

Referring to FIG. 25, a peripheral transistor PTR may be formed on a first substrate 10. The first substrate 10 may be a single crystal semiconductor substrate. Forming the peripheral transistor PTR may include forming an isolation region 15i defining a peripheral active region 15a on the first substrate 10, forming a peripheral gate PG on the peripheral active region 15a, and forming a peripheral source/drain region S/D in the peripheral active region 15a on both sides of the peripheral gate PG.

A first lower insulating layer 25 covering the peripheral transistor PTR may be formed on the first substrate 10. A first peripheral wiring 30, electrically connected to the peripheral transistor PTR, may be formed in the first lower insulating layer 25. A second lower insulating layer 35 may be formed on the first lower insulating layer 25 and the first peripheral wiring 30. A second peripheral wiring 40, which may be electrically connected to the first peripheral wiring 30, may be formed in the second lower insulating layer 35. A third lower insulating layer 45 may be formed on the second lower insulating layer 35. The peripheral transistor PTR, the first peripheral wiring 30 and the second peripheral wiring 40, as well as the first to third lower insulating layers 25, 35, and 45 may form a lower structure 50. The third lower insulating layer 45 is patterned, and thus recess regions 45r may be formed.

Figure 27:
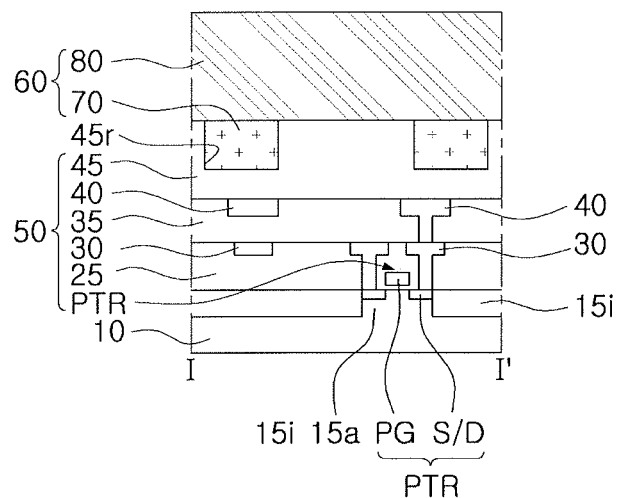

Referring to FIG. 27, pattern portions 70 may be formed in the recess regions 45r. A plate portion 80 may be formed on the pattern portions 70 and the third lower insulating layer 45. The pattern portions 70 and the plate portion 80 may form a second substrate 60.

Forming the second substrate 60 may include forming a first material layer covering the third lower insulating layer 45 while filling the recess regions 45r, exposing the third lower insulating layer 45 by flattening the first material layer, and then forming the plate portion 80 on the third insulating layer 45 by performing a deposition process.

In one example, the first material layer may be formed of an insulating material.

In another example, the first material layer may be formed of a metallic material.

In another example, the first material layer may be formed of a doped semiconductor layer.

In another example, before the first material layer is formed, forming a conductive barrier layer (64 of FIG. 9A) such as Ti/TiN, or the like, may be further included.

In one example, the plate portion 80 may include a semiconductor layer. For example, the plate portion 80 may include an N-type semiconductor layer or a P-type semiconductor layer.

In another example, the plate portion 80 may be provided as a first plate layer (80b1 of FIG. 9B) and a second plate layer (80b2 of FIG. 9B), sequentially stacked.

In another example, the plate portion 80 and the pattern portions 70 may have an integrated structure.

In another example, forming the second substrate 60 may include forming a first material layer covering the third lower insulating layer 45 while filling the recess regions 45r, flattening the first material layer to have a constant thickness on the third lower insulating layer 45, and forming a second material layer on the first material layer. Thus, the first material layer may remain on the third lower insulating layer 45 while filling the recess regions 45r. Thus, the first material layer, remaining in the recess regions 45r, may form pattern portions (70d of FIG. 10A), a first material layer, remaining on the third lower insulating layer 45, may form a first plate layer (80d1 of FIG. 10A) of the plate portion 80, and the second material layer may form a second plate layer (80d2 of FIG. 10A) of the plate portion 80.

In another example, when the second substrate 60, described above, is provided, before a first material layer covering the third lower insulating layer 45 while filling the recess regions 45r is provided, forming a barrier layer (65 of FIG. 10B) may be further included. Moreover, before the second material layer is formed on a first material layer remaining on the third lower insulating layer 45, forming an additional conductive layer (81 of FIG. 10C) may be further included.

In another example, after a first material layer partially filling the recess regions 45r is provided, forming the second substrate 60 may include forming a second material layer covering the third lower insulating layer 45 while filling a remaining region of the recess regions 45r.

In another example, forming the second substrate 60 may include forming pattern portions (70k of FIG. 13) using a deposition and etching process on the lower structure 50, and forming the plate portion (80k of FIG. 13), covering a side surface and an upper surface of the pattern portions (70k of FIG. 13).

Figure 28:
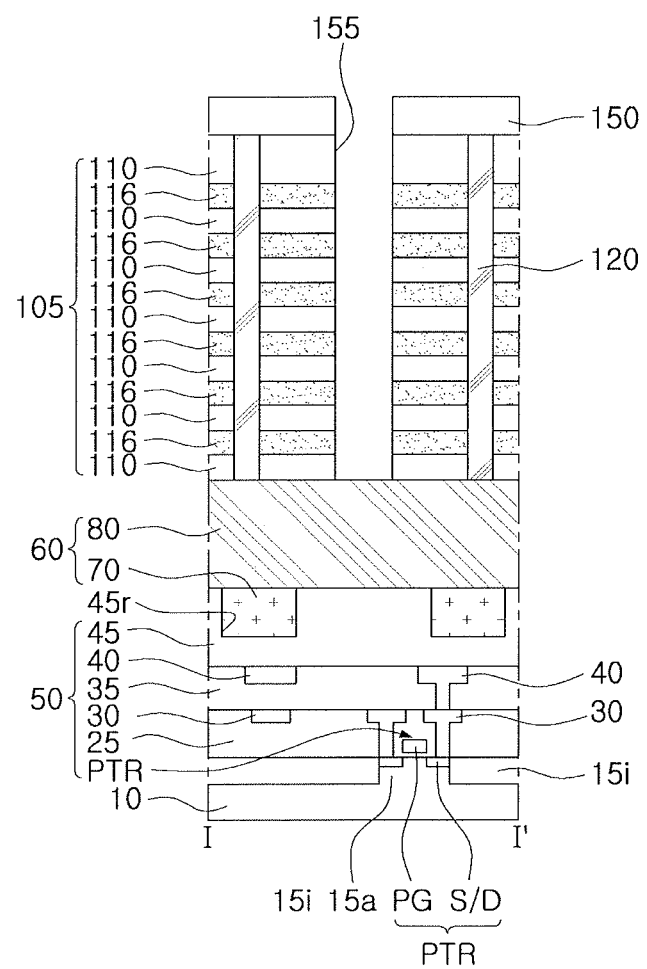

Referring to FIG. 28, a mold structure 105 may be formed on the second substrate 60. The mold structure 105 may include interlayer insulating layers 110 and mold layers 116, alternately and repeatedly stacked. The interlayer insulating layers 110 may be formed of silicon oxide, while the mold layers 116 may be formed of a material having etch selectivity with respect to the interlayer insulating layers 110. For example, the mold layers 116 may be formed of silicon nitride.

Vertical structures 120, passing through the mold structure 105, may be provided.

In an example, the vertical structures 120 may be the vertical structure described with reference to FIG. 7. For example, forming the vertical structures 120 may include forming a hole passing through the mold structure 105 and exposing the plate portion 80 of the second substrate 60, forming a semiconductor pattern (125 of FIG. 7) epitaxially grown from the plate portion 80 exposed by the hole, forming a gate dielectric structure (130 of FIG. 7) on a side wall of the hole on the semiconductor pattern (125 of FIG. 7), forming a channel semiconductor layer (140 of FIG. 7) in contact with the semiconductor pattern (125 of FIG. 7) while covering the gate dielectric structure 130, forming a core pattern (145 of FIG. 7) partially filling the hole on the channel semiconductor layer 140, and forming a pad pattern 147 on the channel semiconductor layer 140 and the core pattern (145 of FIG. 7).

A first capping insulating layer 150 covering the vertical structures 120 may be formed on the mold structure 105. A separation trench 155, passing through the first capping insulating layer 150 and the mold structure 105, may be provided.

Figure 29:
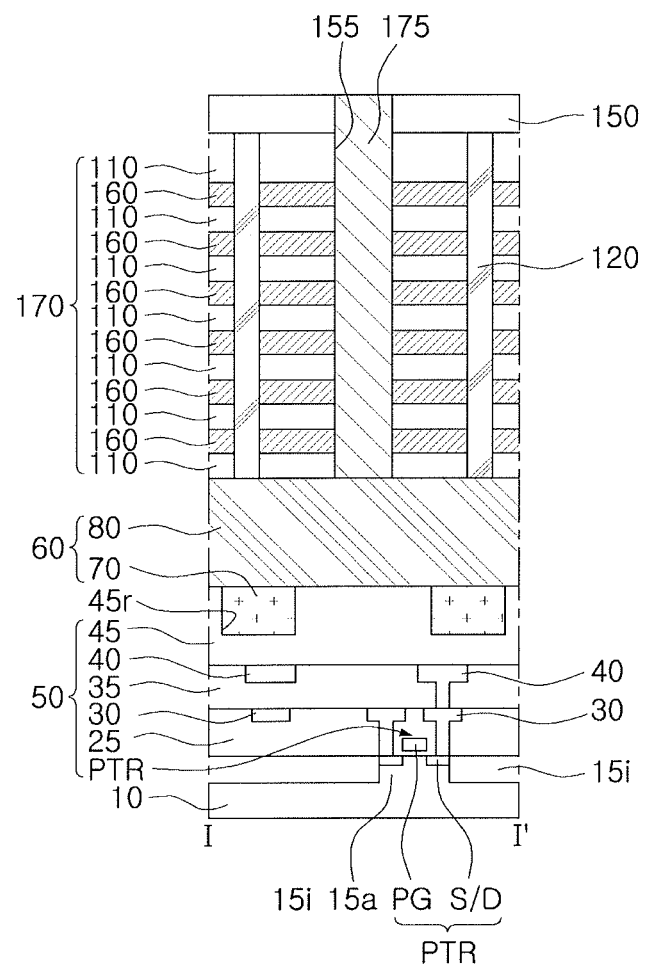

Referring to FIG. 29, the mold layers 116 (see FIG. 28), exposed by the separation trench 155, are removed to form empty spaces, and horizontal conductive patterns 160 may be formed in the empty spaces. Then, a separation structure 175, filling the separation trench 155, may be provided.

Referring again to FIGS. 3A to 5, gate contact structures 180 of pad regions P of the horizontal conductive patterns 160 and a peripheral contact structure 182 on a peripheral contact region 40P of the second peripheral wirings 40 may be provided. Then, after a second capping insulating layer 185 is provided, contact plugs 190, 192, and 194 are formed, and bit lines 195, gate connection wirings 196, and a peripheral connection wiring 198 may be provided on the contact plugs 190, 192, and 194.

In an example embodiment, the second substrate 60 may include the pattern portions 70 and the plate portion 80. The plate portion 80 may include a semiconductor layer, and the pattern portions 70 may be formed of a conductor having electrical resistance lower than that of the semiconductor layer of the plate portion 80. Thus, the pattern portions 70 may improve electrical characteristics of the second substrate 60. For example, when the plate portion 80 includes a polysilicon layer having N-type conductivity, which may serve as a common source line CSL, the pattern portions 70, which may be formed of tungsten, or the like, having electrical resistance lower than that of the polysilicon layer, may help to improve electrical characteristics of the common source line CSL.

In an example embodiment, the second substrate 60 may include the pattern portions 70 and the plate portion 80. When a three-dimensional semiconductor device according to an example embodiment is provided in the form of a semiconductor chip, or a semiconductor process is carried out in the form of a semiconductor wafer, the pattern portions 70 may help to prevent warpage of a three-dimensional semiconductor device, including the second substrate 60. For example, in the three-dimensional semiconductor device as illustrated in FIG. 2, when stress is generated in any one direction or three-dimensionally by the upper structure (100 of FIG. 2) disposed above the second substrate 60, the pattern portions 70 of the second substrate 60 may help to prevent a three-dimensional semiconductor device from warping by the upper structure 100. The pattern portions 70 may be selected and provided in the form of one among various flat shapes as illustrated in FIGS. 3A, and 17 to 21, according to a shape of warpage generated by the upper structure 100.

Thus, the pattern portions 70 and various pattern portions 70a to 70m, 270a and 270b, as well as 370a to 370e to be modified may be referred to as a 'warpage preventing pattern', 'stress pattern' or 'supporting pattern.'

By way of summation and review, to improve a degree of integration of a semiconductor device, a peripheral circuit may be on a lower substrate and an upper substrate, and a memory array region may be on the upper substrate.

As described above, a peripheral circuit, an upper substrate, and a memory cell array may be sequentially disposed in a vertical direction on the lower substrate, so warpage of a semiconductor device may be reduced or prevented.

As described above, embodiments may provide a three-dimensional semiconductor device including a lower structure on a first substrate, a second substrate on the lower structure, and an upper structure on the second substrate. The lower structure may include a peripheral circuit, and the upper structure may include a memory cell array. Thus, embodiments may provide a three-dimensional semiconductor device with an improved degree of integration.

Embodiments may provide a three-dimensional semiconductor device capable of preventing or significantly reducing warpage. The second substrate may include pattern portions and a plate portion covering the pattern portions. The plate portion may include a semiconductor layer. The pattern portions may prevent warpage of a three-dimensional semiconductor device, or may significantly reduce warpage. As described above, a three-dimensional semiconductor device, capable of preventing warpage or significantly reducing warpage, may be provided, so a defect generated by the warpage may be reduced. Thus, productivity may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor device, comprising:
    a first substrate;
    a second substrate on the first substrate, the second substrate including pattern portions and a plate portion covering the pattern portions, the plate portion having a width greater than a width of each of the pattern portions and being directly connected to the pattern portions;
    a lower structure between the first substrate and the second substrate;
    horizontal conductive patterns on the second substrate, the horizontal conductive patterns being stacked while being spaced apart from each other in a direction perpendicular to an upper surface of the second substrate; and
    a vertical structure on the second substrate and having a side surface opposing the horizontal conductive patterns,
    wherein the pattern portions include a pair of pattern portions adjacent to each other and parallel to each other, and
    wherein each of the pair of pattern portions has a linear shape extended in a first direction.

2. The three-dimensional semiconductor device as claimed in claim 1, wherein the plate portion includes a semiconductor layer.

3. The three-dimensional semiconductor device as claimed in claim 2,
    wherein the pattern portions include a material different from the semiconductor layer of the plate portion.

4. The three-dimensional semiconductor device as claimed in claim 3, wherein the pattern portions include an insulating material.

5. The three-dimensional semiconductor device as claimed in claim 1, wherein:
the plate portion includes a semiconductor layer having N-type conductivity, and
the pattern portions include a conductive material having an electrical resistance lower than an electrical resistance of the semiconductor layer.

6. The three-dimensional semiconductor device as claimed in claim 1, wherein the horizontal conductive patterns are gate patterns, and
wherein at least a portion of the vertical structure is a channel.

7. The three-dimensional semiconductor device as claimed in claim 6, further comprising:
a source contact structure on the plate portion;
a peripheral contact structure on a peripheral contact region of a peripheral wiring of the lower structure; and
a peripheral connection wiring electrically connecting the source contact structure to the peripheral contact structure.

8. The three-dimensional semiconductor device as claimed in claim 6, further comprising a contact plug between a peripheral wiring of the lower structure and the pattern portions, the contact plug electrically connecting the peripheral wiring to the pattern portions,
wherein an upper surface of the contact plug directly contacts at least one of the pattern portions, and
wherein a lower surface of the contact plug directly contacts the peripheral wiring.

9. The three-dimensional semiconductor device as claimed in claim 1, wherein:
a lower insulating layer of the lower structure covers a lower surface and a side surface of the pattern portions, and
the plate portion is connected to an upper surface of the pattern portions.

10. The three-dimensional semiconductor device as claimed in claim 1, wherein:
the plate portion is connected to the pattern portions while covering an upper surface and a side surface of the pattern portions, and
a lower insulating layer of the lower structure covers a lower surface of the pattern portions.

11. The three-dimensional semiconductor device as claimed in claim 1, further comprising a barrier layer between the pattern portions and the lower structure,
wherein the barrier layer directly contacts a lower surface and a side surface of each of the pattern portions.

12. The three-dimensional semiconductor device as claimed in claim 1,
wherein the pattern portions and the plate portion have an integrated structure,
wherein the pattern portions extend from the plate portion toward the first substrate, and
wherein the pattern portions and the plate portion include a polysilicon having N-type conductivity.

13. The three-dimensional semiconductor device as claimed in claim 1, wherein:
the plate portion includes a first plate layer and a second plate layer on the first plate layer,
the second plate layer includes a semiconductor layer, and
the first plate layer includes a material different from the second plate layer.

14. The three-dimensional semiconductor device as claimed in claim 13, further comprising an additional conductive layer between the first plate layer and the second plate layer.

15. The three-dimensional semiconductor device as claimed in claim 1, wherein:
each of the pattern portions includes a first pattern portion and a second pattern portion on and in contact with the first pattern portion, and
the first pattern portion and the second pattern portion are formed of different materials.

16. The three-dimensional semiconductor device as claimed in claim 15, wherein the second pattern portion has an integrated structure with at least a portion of the plate portion.

17. The three-dimensional semiconductor device as claimed in claim 1, further comprising a connection portion connected to the pair of pattern portions and extended from the pair of pattern portions on a same plane as the pattern portions,
wherein:
the plate portion covers the connection portion, and
the connection portion is integrally formed with the pair of pattern portions.

18. The three-dimensional semiconductor device as claimed in claim 1,
wherein at least one of the horizontal conductive patterns has a linear shape extended in a second direction perpendicular to the first direction.

19. A three-dimensional semiconductor device, comprising:
a first substrate;
a second substrate on the first substrate, the second substrate including pattern portions and a plate portion in contact with the pattern portions while covering the pattern portions;
a lower structure between the first substrate and the second substrate; and
an upper structure on the second substrate, wherein:
the lower structure includes a peripheral wiring,
the plate portion includes a semiconductor layer,
the plate portion has a width greater than a width of each of the pattern portions, and
at least two adjacent pattern portions are connected by a connection portion that extends between the at least two adjacent pattern portions on a same plane as the at least two adjacent pattern portions, the connection portion being integrally formed with the at least two adjacent pattern portions.

20. A three-dimensional semiconductor device, comprising;
a first substrate;
a second substrate on the first substrate, the second substrate including pattern portions, a plate portion directly connected to the pattern portions while covering the pattern portions, and a conductive barrier layer directly contacting the plate portion and the pattern portions;
a lower structure between the first substrate and the second substrate, and including a peripheral wiring and an insulating layer covering the peripheral wiring;
horizontal conductive patterns on the second substrate, the horizontal conductive patterns being stacked while being spaced apart from each other in a direction perpendicular to an upper surface of the second substrate; and
a vertical structure on the second substrate and having a side surface opposing the horizontal conductive patterns, wherein:
the plate portion includes a semiconductor layer, the pattern portions extend from the plate portion toward the first substrate, and the conductive barrier layer includes a first portion between a lower surface of the plate portion and an upper surface of the insulating layer, and a second portion covering a lower surface and a side surface of each of the pattern portions.

\* \* \* \* \*